United States Patent
Notte, IV et al.

(10) Patent No.: US 9,530,611 B2
(45) Date of Patent: Dec. 27, 2016

(54) CHARGED PARTICLE BEAM SYSTEM AND METHOD OF OPERATING A CHARGED PARTICLE BEAM SYSTEM

(71) Applicant: Carl Zeiss Microscopy, LLC, Thornwood, NY (US)

(72) Inventors: John A. Notte, IV, Gloucester, MA (US); Alexander Groholski, Salem, MA (US); Robert Conners, Lynn, MA (US); Mark D. DiManna, Fremont, NH (US); Raymond Hill, Rowley, MA (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 86 days.

(21) Appl. No.: 14/314,219

(22) Filed: Jun. 25, 2014

(65) Prior Publication Data
US 2015/0008341 A1    Jan. 8, 2015

Related U.S. Application Data

(60) Provisional application No. 61/843,779, filed on Jul. 8, 2013, provisional application No. 61/843,772, filed on
(Continued)

(51) Int. Cl.
*H01J 37/18* (2006.01)
*H01J 37/08* (2006.01)
*H01J 27/26* (2006.01)

(52) U.S. Cl.
CPC ............... *H01J 37/18* (2013.01); *H01J 27/26* (2013.01); *H01J 37/08* (2013.01);
(Continued)

(58) Field of Classification Search
CPC .................................................. H01J 2237/188
See application file for complete search history.

(56) References Cited

U.S. PATENT DOCUMENTS 3,150,817 A * 9/1964 Jepsen ................... H01J 41/12
                                                        251/210
4,157,471 A    6/1979 Mlekodaj
(Continued)

FOREIGN PATENT DOCUMENTS

EP    0 399 374 A1    11/1990
EP    2 068 343 A1    6/2009
(Continued)

OTHER PUBLICATIONS

Galovich C S et al: "A New Method for Improving Gallium Liquid Metal Ion Source Stability", Journal of Vacuum Science and Technology: Part B. AVS / AIP. Melville, New York. NY, US, vol. 6, No. 6, Nov. 1, 1988 (Nov. 1, 1988), pp. 2108-2111.
(Continued)

*Primary Examiner* — Jack Berman
(74) *Attorney, Agent, or Firm* — Fish & Richardson P.C.

(57) ABSTRACT

The present disclosure relates to a charged particle beam system, comprising a noble gas field ion beam source, a charged particle beam column, and a housing defining a first vacuum region and a second vacuum region. A noble gas field ion beam source is arranged within the first vacuum region. A first mechanical vacuum pump is functionally attached to the first vacuum region, an ion getter pump is attached to the charged particle beam column, and a gas supply is attached to the first vacuum region configured to supply a noble gas to the noble gas field ion beam source.

19 Claims, 10 Drawing Sheets

US 9,530,611 B2

Page 2

Related U.S. Application Data

Jul. 8, 2013, provisional application No. 61/843,777, filed on Jul. 8, 2013, provisional application No. 61/843,785, filed on Jul. 8, 2013, provisional application No. 61/843,812, filed on Jul. 8, 2013.

(52) U.S. Cl.
CPC . *H01J 2237/0807* (2013.01); *H01J 2237/188* (2013.01); *H01J 2237/1825* (2013.01)

(56) References Cited

U.S. PATENT DOCUMENTS

| | | | | |
|---|---|---|---|---|
| 4,352,643 | A * | 10/1982 | Iijima | F04D 29/661 248/610 |
| 4,833,899 | A * | 5/1989 | Tugal | F04B 37/08 248/638 |
| 5,304,514 | A | 4/1994 | Nishibe et al. | |
| 5,376,799 | A * | 12/1994 | Schamber | H01J 37/18 250/441.11 |
| 5,418,707 | A | 5/1995 | Shimer | |
| 6,724,001 | B1 | 4/2004 | Pinckney et al. | |
| 7,511,279 | B2 * | 3/2009 | Ward | B82Y 10/00 250/423 F |
| 7,615,765 | B2 * | 11/2009 | Katagiri | H01J 37/18 250/492.1 |
| 7,947,129 | B2 | 5/2011 | Murata et al. | |
| 8,101,922 | B2 | 1/2012 | Winkler | |
| 8,115,184 | B2 * | 2/2012 | Shichi | H01J 27/26 250/309 |
| 8,211,701 | B2 | 7/2012 | Spence et al. | |
| 8,263,943 | B2 | 9/2012 | Shichi et al. | |
| 8,481,980 | B2 * | 7/2013 | Shichi | H01J 27/10 250/288 |
| 8,530,857 | B2 * | 9/2013 | Ooae | F16C 29/025 250/440.11 |
| 8,822,945 | B2 | 9/2014 | Nishinaka et al. | |
| 8,963,100 | B2 | 2/2015 | Yasaka et al. | |
| 9,117,630 | B2 | 8/2015 | Sato | |
| 9,218,934 | B2 | 12/2015 | Notte et al. | |
| 9,218,935 | B2 | 12/2015 | Notte et al. | |
| 2005/0184028 | A1 | 8/2005 | Baur et al. | |
| 2007/0085029 | A1 | 4/2007 | Baxter | |
| 2009/0001266 | A1 | 1/2009 | Frosien | |
| 2009/0230299 | A1 | 9/2009 | Shichi et al. | |
| 2010/0294930 | A1 | 11/2010 | Preikszas et al. | |
| 2011/0147609 | A1 | 6/2011 | Shichi et al. | |
| 2011/0233401 | A1 | 9/2011 | Nishinaka et al. | |
| 2012/0097863 | A1 | 4/2012 | Saho et al. | |
| 2012/0119086 | A1 | 5/2012 | Shichi et al. | |
| 2012/0132802 | A1* | 5/2012 | Arai | H01J 27/26 250/310 |
| 2012/0138815 | A1 | 6/2012 | Hill et al. | |
| 2012/0199758 | A1 | 8/2012 | Kawanami et al. | |
| 2013/0070223 | A1* | 3/2013 | Peijster | G02B 7/003 355/53 |
| 2013/0112138 | A1 | 5/2013 | Liu | |
| 2013/0126731 | A1* | 5/2013 | Shichi | H01J 37/08 250/310 |
| 2013/0264496 | A1 | 10/2013 | Arai | |
| 2014/0231379 | A1 | 8/2014 | Pitters et al. | |
| 2014/0299768 | A1 | 10/2014 | Shichi et al. | |
| 2015/0008332 | A1 | 1/2015 | Notte et al. | |
| 2015/0008333 | A1 | 1/2015 | Notte et al. | |
| 2015/0008334 | A1 | 1/2015 | Notte et al. | |
| 2015/0008342 | A1 | 1/2015 | Notte et al. | |
| 2016/0104598 | A1 | 4/2016 | Notte et al. | |
| 2016/0111243 | A1 | 4/2016 | Notte et al. | |

FOREIGN PATENT DOCUMENTS

| | | |
|---|---|---|
| EP | 2 088 613 A1 | 8/2009 |
| EP | 2 110 843 A1 | 10/2009 |
| EP | 2 182 542 A1 | 5/2010 |
| JP | S58-135558 A | 8/1983 |
| JP | S 58-142738 | 8/1983 |
| JP | S 59-37640 | 3/1984 |
| JP | S59-163728 | 11/1984 |
| JP | S 61-138437 | 6/1986 |
| JP | H01-265444 A | 10/1989 |
| JP | H04-133253 A | 5/1992 |
| JP | H08-203461 A | 8/1996 |
| JP | H09-92192 A | 4/1997 |
| JP | 9-283039 | 10/1997 |
| JP | 10-208652 | 8/1998 |
| JP | 2000-195454 A | 7/2000 |
| JP | 2001-512900 A | 8/2001 |
| JP | 2004-014309 | 1/2004 |
| JP | 2009-517838 A | 4/2009 |
| JP | 2009-301920 | 12/2009 |
| JP | 2011-014245 A | 1/2011 |
| JP | 2012-032004 A | 2/2012 |
| JP | 5178926 B2 | 4/2013 |
| JP | 2013-084489 A | 5/2013 |
| JP | 2013-089534 A | 5/2013 |
| JP | 2013-089538 A | 5/2013 |
| WO | WO 99/07924 A1 | 2/1999 |
| WO | WO 2007/067310 | 6/2007 |
| WO | WO 2008/015213 A2 | 12/2008 |
| WO | WO 2012/086419 | 6/2012 |
| WO | WO 2013/043794 A2 | 3/2013 |

OTHER PUBLICATIONS

Japanese Office Action, with English translation thereof, for corresponding JP Appl No. 2014-140043, dated Jul. 5, 2016.

* cited by examiner

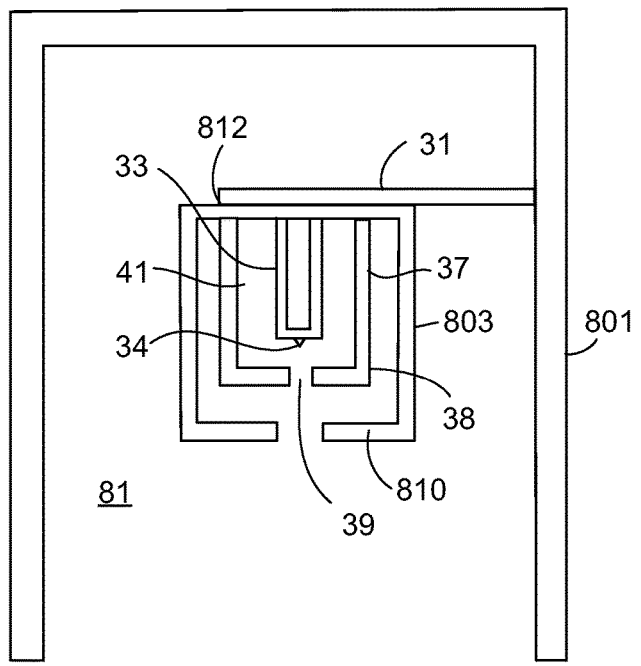
FIG. 12
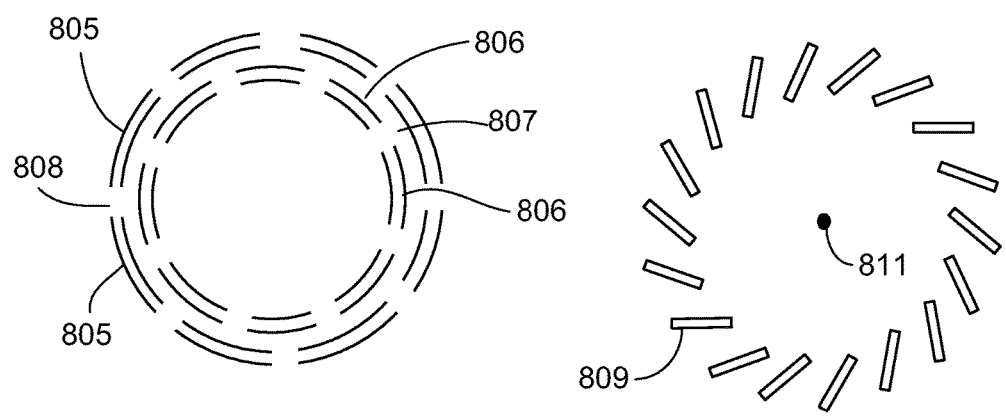
FIG. 13A
FIG. 13B

CHARGED PARTICLE BEAM SYSTEM AND METHOD OF OPERATING A CHARGED PARTICLE BEAM SYSTEM

CROSS-REFERENCE TO RELATED APPLICATIONS

This application claims priority under 35 U.S.C. §119(e)(1) to U.S. Provisional Application Nos. 61/843,772, 61/843,777, 61/843,779, 61/843,785 and 61/843,812, filed Jul. 8, 2013. The contents of these application are hereby incorporated by reference in their entirety.

FIELD

This disclosure relates to a charged particle beam system, a charged particle source for a charged particle beam system, especially a gas field ion source, and methods of operating a charged particle beam system.

BACKGROUND

Charged particle source, charged particle systems and methods of operating charged particle systems and sources can be used for various applications including measuring or identifying sample properties or for sample modification. A charged particle source typically produces a beam of charged particles that can be directed by components of a charged particle beam system to be incident on a sample. By detecting interaction products of the charged particle beam with the sample images of a sample can be generated or properties of the sample can be identified.

The following documents include prior art which can be of some relevance for the present disclosure: EP2088613A1, EP2182542A1, US2012119086, EP2068343A1, EP2110843A1, US2012132802, US2012199758, WO 2007067310, WO08152132A2.

SUMMARY

According to a first aspect, the disclosure relates to a charged particle beam system, comprising a noble gas field ion beam source, a charged particle beam column, and a housing defining a first vacuum region and a second vacuum region. The noble gas field ion beam source is arranged within the first vacuum region. A first mechanical vacuum pump is functionally attached to the first vacuum region, an ion getter pump is attached to the charged particle beam column, and a gas supply is attached to the first vacuum region configured to supply a noble gas to the noble gas field ion beam source.

Embodiments further comprise a sample chamber. The charged particle beam column can be positioned between the first vacuum region and the sample chamber adjacent to the first vacuum region.

In a further embodiment, the charged particle beam system further comprises a control configured to switch-off the ion getter pump at times when the noble gas field ion beam source generates an ion beam.

In a still further embodiment, the control is further configured to switch-on the ion getter pump only if a pressure within the first vacuum region is below a predefined pressure value.

In a still further embodiment, the charged particle beam system further comprises a heater and a control configured to heat the heater to release atoms of the noble gas from the ion getter pump.

In a still further embodiment, the charged particle beam system further comprises a flange to which the ion getter pump is attached to the charged particle beam system, and a valve arranged within the flange between the ion getter pump and the charged particle beam column.

In a still further embodiment, the charged particle beam system further comprises a sample chamber, a table with a high mass on which the sample chamber is positioned, a first vibration isolating system between the table and a floor onto which the table is to be positioned and a second vibration damping system arranged between the table and the sample chamber. The first mechanical vacuum pump can be arranged at the table, and the first mechanical vacuum pump can be connected to the first vacuum region via at least one flexible bellow.

In a still further embodiment, the at least one flexible bellow comprises a first flexible bellow portion, a second flexible bellow portion and a stiff tube or a flange between the first flexible bellow portion and the second flexible bellow portion.

In a still further embodiment the table comprises a plate of stone or concrete.

In a still further embodiment, the charged particle beam system further comprises a sample chamber and a sample stage moveably arranged within the sample chamber and ion optics and aperture plates arranged between the noble gas field ion source and the sample stage. The housing can be directly mounted to a tubular portion of the sample chamber. The tubular portion can form an integral and non-detachable part of the sample chamber. And the ion optics and aperture plates can be mounted within the tubular portion.

In a still further embodiment, the housing is a first housing, and the charged particle beam system further comprises an electrically conductive tip having a tip apex arranged in the first housing. The first housing can have a first portion of a tiltable mount. A second housing can comprise charged particle optical components defining an optical axis, and the second housing can comprise a second portion of a tiltable mount configured to correspond to the first portion of the tiltable mount in a manner that the first housing can be tilted relative to the second housing.

The first and second portions of the tiltable mount can be configured to form an air bearing. A motor drive configured to apply a tilt movement to the first housing relative to the second housing can be provided, and a controller configured to control the motor drive and an air supply of the air bearing can be provided.

In a still further embodiment, the charged particle beam system further comprises a measuring device configured to measure and store a tilting position of the first housing relative to the second housing.

In a still further embodiment, the controller is configured to control a tilt movement of the first housing by the motor drive to reposition the first housing into a previously stored tilting position.

In a still further embodiment, the controller is further configured to stop the supply of air of the air bearing when the measuring device provides a signal that a previously stored tilting position has been reached.

In a still further embodiment, the charged particle beam system further comprises a moveable peg configured to be moved by the motor drive, and a receptacle attached to the first housing. The peg can be configured to contact that receptacle, and the controller can be further configured to drive the motor drive in a direction to disengage contact between the peg and the receptacle when the air supply of the air bearing is switched-off.

In a still further embodiment, the gas supply comprises a leak valve providing a constant gas flow rate through the leak valve. An actuator can be provided which is configured to act on the leak valve to change the constant gas flow rate through the leak valve. A sensor configured to measure a gas pressure in the housing and generating output signals can be provided. A controller configured to control a movement of the actuator to change the gas flow rate through the leak valve based on output signals of the sensor can be provided and the controller can be configured to control the movement of the actuator after a specific interaction of a user.

Another aspect of the inventions relates to a charged particle beam system which comprises a charged particle beam source, a charged particle beam column, a sample chamber, a table with a high mass on which the sample chamber is positioned, a first vibration isolating system between the table and a floor onto which the table is to be positioned, a second vibration isolation system arranged between the table and the sample chamber and at least one vacuum pump functionally connected to at least one of the sample chamber, the charged particle source and the charged particle column. The at least one vacuum pump can be arranged at the table, and the vacuum pump can be connected to the at least one of the sample chamber, the charged particle source and the charged particle column via at least one flexible bellow.

Another aspect of the inventions relates to a charged particle beam system which comprises a charged particle beam source, a first housing in which the charged particle source is mounted, a sample chamber comprising a second housing and a sample stage moveably arranged within the sample chamber, and ion optics and aperture plates arranged between the charged particle beam source and the sample stage. The first housing can be directly mounted to a tubular portion of the second housing, and the tubular portion can form an integral part of the second housing. The ion optics and aperture plates can be mounted within the tubular portion.

Another aspect of the inventions relates to a charged particle beam system, which comprises an electrically conductive tip having a tip apex and a holder for holding the electrically conductive tip. The holder can have a first portion of a tiltable mount. A housing comprising charged particle optical components defining an optical axis can comprise a second portion of a tiltable mount configured to correspond to the first portion of the tiltable mount in a manner that the holder can be tilted relative to the housing. The first and second portions of the tiltable mount can be configured to form an air bearing. A motor drive configured to apply a tilt movement to the holder relative to the housing can be provided as well as a controller configured to control the motor drive and an air supply of the air bearing.

Another aspect of the inventions relates to a gas field ion source which comprises a housing, an electrically conductive tip arranged within the housing, a gas supply for supplying one or more gases to the housing, wherein the gas supply comprises a leak valve providing a constant gas flow rate through the leak valve. In addition an actuator configured to act on the leak valve to change the constant gas flow rate through the leak valve can be provided. In addition a sensor configured to measure a gas pressure in the housing and generating output signals and a controller configured to control a movement of the actuator to change the gas flow rate through the leak valve based on output signals of the sensor can be provided. The controller can be configured to control the movement of the actuator after a specific interaction of a user.

DESCRIPTION OF DRAWINGS

Details of embodiments will hereinafter be described with reference to the attached drawings.

FIG. 12 show a cross section of a gas field ion source with a heat shield.

FIGS. 13a and 13b show embodiments of heat shields allowing gas exchange.

DETAILED DESCRIPTION

Figure 1:
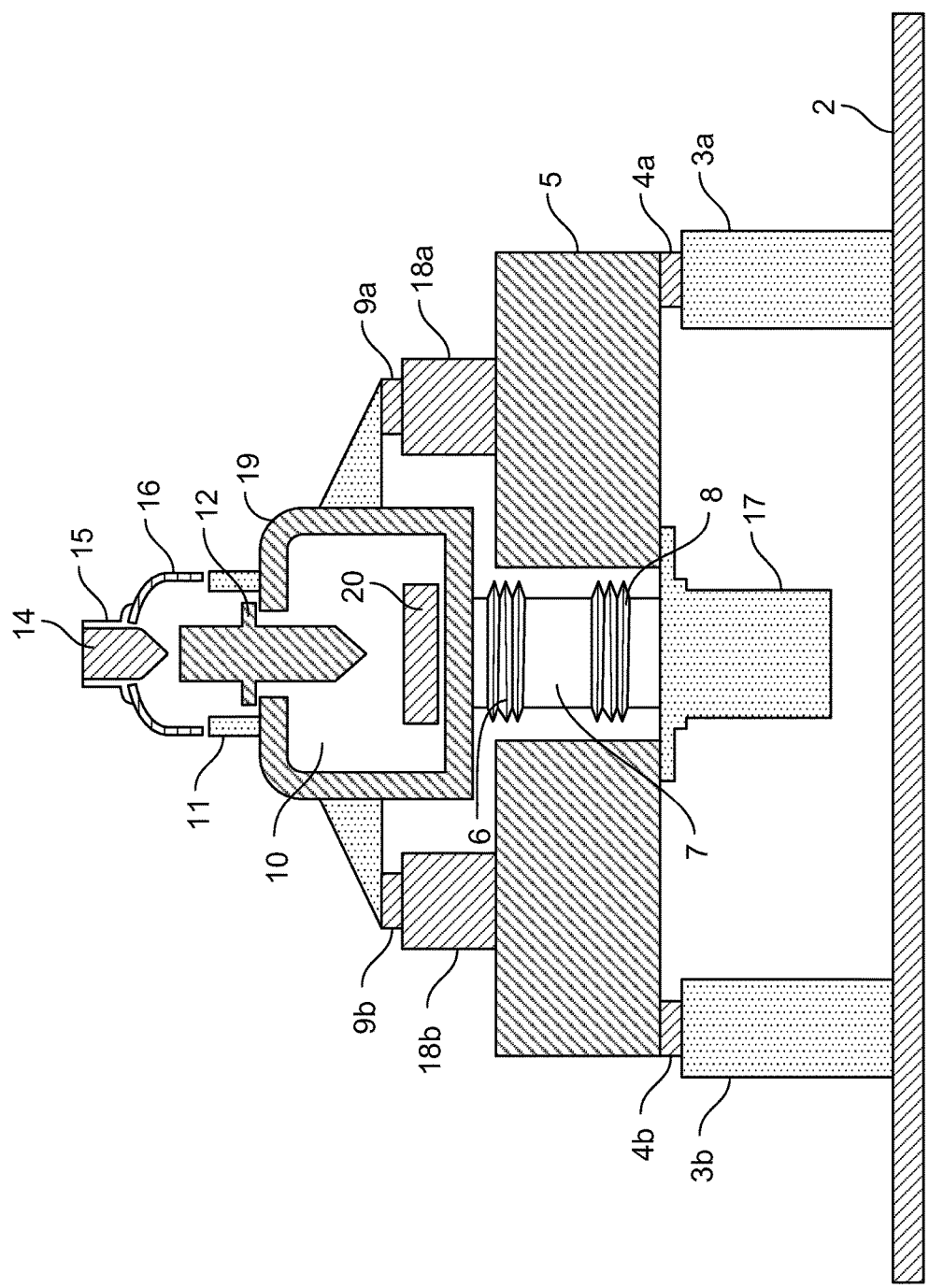
FIG. 1 shows the mechanical set-up of a charged particle beam system in a sectional view.

The charged particle beam system 1 in FIG. 1 comprises a sample chamber 10 which is positioned and mounted on a heavy and massive table 5. The table 5 can be a granite plate or a plate made of concrete. The table 5 itself rests on a number of first legs 3a and 3b of which two are shown in FIG. 1. The first legs 3a, 3b are designed to become positioned on a floor 2. Each of the first legs 3a, 3b comprise or support a first vibration isolation member 4a, 4b to avoid the transmission of vibrations from the floor to the table 5.

The sample chamber 10 rests on the table 5 via a number of second legs 18a, 18b also each comprising or supporting a second vibration isolation member 9a, 9b. These second vibration isolation members 9a, 9b serve to reduce or avoid the transmission of vibrations from the table 5 to the sample chamber. Such vibrations of the table 5 can originate from a mechanical vacuum pump 17, for example a turbo pump, which is firmly attached to or mounted on the table 5. Due to the large mass of the table 5 the vibration amplitudes generated by the mechanical pump 17 are greatly reduced.

The mechanical pump 17 is functionally connected to the sample chamber 10. For this functional connection a suction port of pump 17 is connected via two flexible bellow portions 6,8 with a stiff tube 7 or a compact vacuum flange between both flexible bellow portions to the sample chamber 10. The complete line from the pump 17 to the sample chamber forms a series arrangement of "flexible bellow portion-stiff tube-flexible bellow portion". This arrangement serves to further attenuate the vibrational energy, and reduce the vibrations transmitted from the table to the chamber. The vibrations of the chamber can be reduced further when the mass of the intermediate tube is large. The vibrations of the chamber can be further reduced if there is an energy absorbing material in contact with the bellows or the tube. The chamber vibrations can be further reduced if there is a mechanical resonance of the tube and bellows that preferentially absorbs and dissipates the vibrational energy at the frequencies caused by the pump (17).

In a particular embodiment described later, the charged particle beam system can have more than one mechanical pumps, especially two turbo molecular pumps. As a way of reducing the effect of vibrations on the image quality, both (or if there are more than two turbo molecular pumps all) of the turbo-molecular pumps are connected to the charged particle beam system via a sequential pair of flexible bellows. The charged particle beam system can have two turbo-molecular pumps, one for the chamber and one for the gun.

The double bellow arrangement serves to prevent the vibrations inherent in the rotational frequency of the pump (e.g. 900 Hz or 1 kHz and their harmonics) from transferring to the microscope. The turbo pump itself is mounted firmly to the large granite platform (table 5) selected for its large mass and inherent damping capabilities, and this serves to diminish the measurable vibration on the granite to the nanometer or sub-nanometer level. The vibration transfer to the microscope is further reduced by the sequence of two successive bellows with a stiff tube between them. The turbo vibration measured in the sample chamber 10 or in the region of the charged particle source is generally below sub-nanometer or sub-angstrom level. In this manner, adequate pumping speed can be attained (e.g. 200 liters/second of vacuum pumping speed or more) without adversely degrading image quality.

The sample chamber 10 has a vacuum tight housing 19. A tubular extension 11 is firmly and non-detachable mounted to the housing 19 of the sample chamber 10. The tubular extension 11 can be formed by a metal tube welded to the remaining portions of the housing 19 surrounding the sample chamber 10. Alternatively, the tubular extension can be an integral part of the chamber housing itself.

Within the tubular extension 11 a charged particle column 12 is mounted. The charged particle column 12 thereby comprises lenses, diaphragms and beam scanning systems not shown in FIG. 1. By directly mounting the components of the charged particle column 12 within a tubular extension of the housing 19 of the sample chamber 10 mechanical vibrations between the components of the charged particle column and a sample stage 20 arranged within the sample chamber 10 can be avoided or at least reduced.

On the tubular extension 11 of the housing 19 of the sample chamber a module comprising the charged particle source is attached. This module comprises a lower housing portion 16 having an upper spherical surface which forms one portion of a two axes tilt mount. In addition this source module comprises an upper housing 15 in which the charged particle emitter is mounted. In the shown case the charged particle source is a gas field ion source and the charged particle emitter 14 is an electrically conductive tip. The upper housing 15 also has a spherical surface portion forming a second part of the two axis tilt mount. By the aid of this tilt mount the upper housing portion 15 holding the charged particle emitter 14 can be tilted about two axes relative to the charged particle column 12 to align the axis of emission of charged particles emitted by the charged particle emitter 14 to an optical axis defined by the charged particle components arranged within the charged particle column 12.

The tilt mount can be designed as an air bearing in the manner that either the spherical surface of the upper housing 15 or the spherical surface of the lower housing 16 comprises small channels (not shown) through which an air flow can be provided which lifts the upper housing so that the upper housing is easily moveable relative to the lower housing. By stopping the air flow the upper housing and the lower housing are held together by strong frictional forces between the upper housing and the lower housing.

Figure 2:
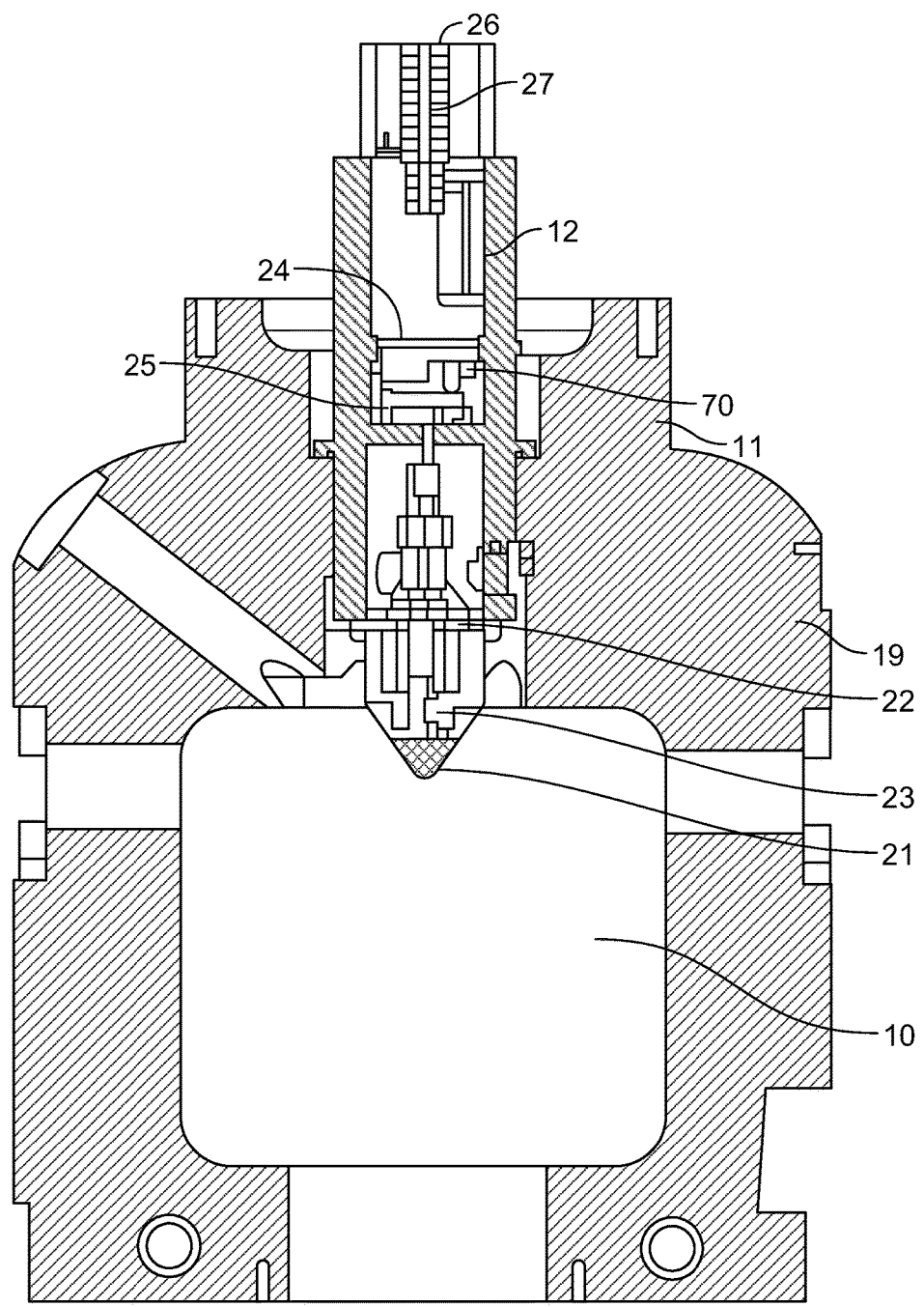
FIG. 2 shows an enlarged sectional view of the particle chamber of the charged particle beam system in FIG. 1.

In FIG. 2 the housing 19 of the sample chamber 10 with the tubular extension is shown in more details. The charged particle column 12 mounted in the tubular portion 11 comprises several diaphragms 22, a deflection system 23 and an objective lens 21 with which a charged particle beam can be focused onto a sample and scanned across a sample which can be positioned on a sample stage (not shown here) in the sample chamber 10. In the case that the charged particle beam system is a gas field ion beam system the lens 21 and the deflection system 22 are electrostatic components which act on the ions by electrostatic forces due to different electrostatic potentials applied to components of the systems. In addition the charged particle column 12 comprises a first pressure limiting aperture 24 and a second pressure limiting aperture 25 which form an intermediate vacuum region (mid column region 70) between the vacuum region in which the emitter tip 14 is positioned and the sample chamber 10. The component of the charged particle column 12 closes to the emitter of the gas field ion source is an electrode 26 forming a part of a condenser lens followed by a deflector 27 for aligning the beam coming from the gas field ion source to the optical axis defined by the charged particle optical components following downward in the direction of beam propagation to the sample chamber 10.

Figure 3:
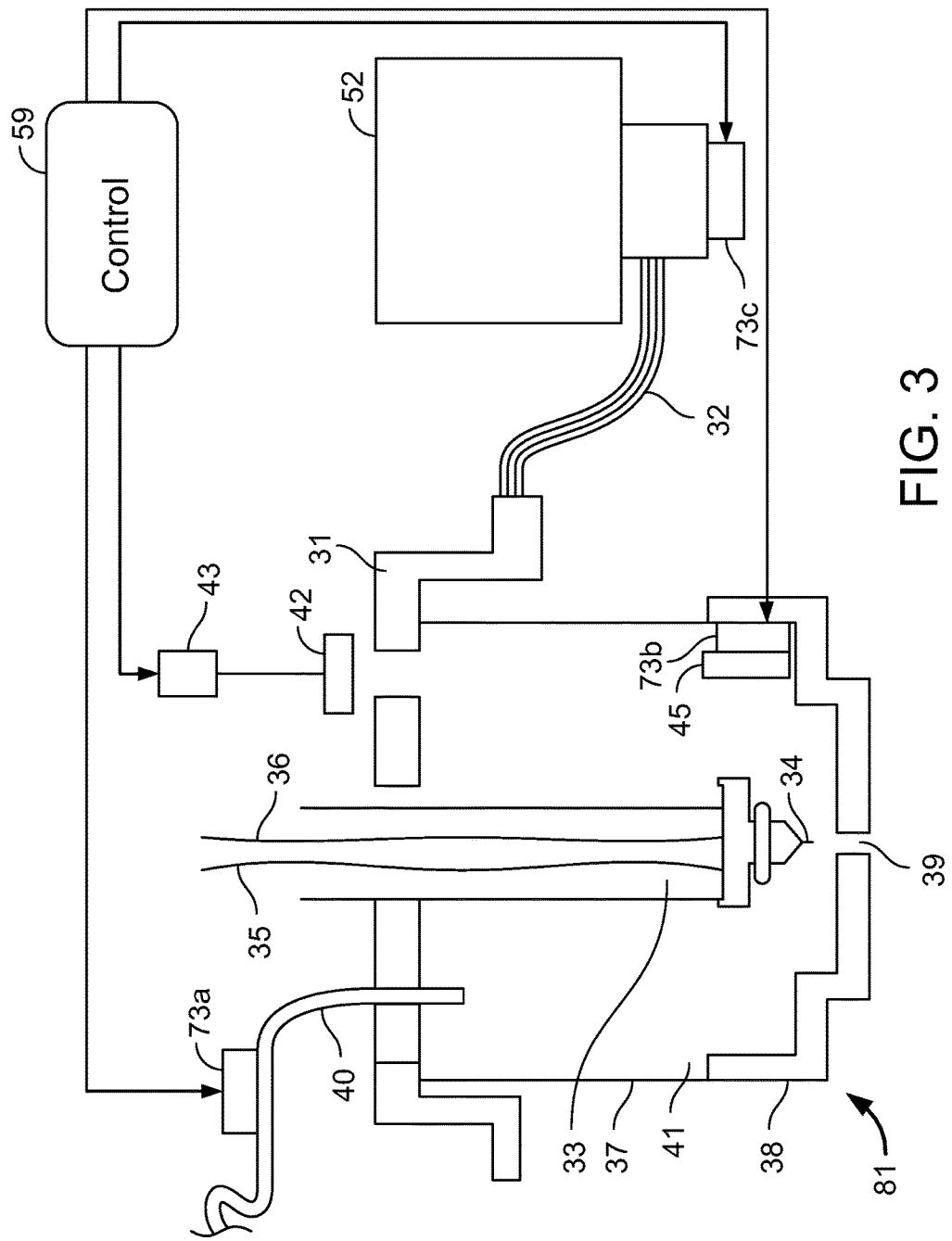
FIG. 3 shows an enlarge sectional view of gas field ion source.

In FIG. 3 the design of a compact gas field ion source is shown. This gas field ion source is designed with double nested insulators. This is a compact design while still providing high voltage, variable beam energy, and gas containment. The design consists of several parts. The first part is a thermally conductive (e.g. copper) base platform 31 which is grounded and is directly linked and thermally connected to a cryogenic cooling system 52 by way of a flexible thermal conductor 32, for example copper ribbons or copper braids. The flexibility of the thermal conductor 32 allows the complete gas field ions source to tilt, and to minimize any vibration transport. The thermal conductivity of the braids allows them to also heat the gas field ion source as a periodic maintenance procedure.

The cryogenic cooling system can be a dewar filled with liquid and/or solid nitrogen. Alternatively, the cryogenic cooling system can be a dewar filled with solid nitrogen. The dewar can comprise a heater 73c with which the dewar as well as the base platform 31 can be heated. Alternatively, the cryogenic cooling system can be a mechanical refrigerator.

Attached to this grounded base platform 31 is a central tubular high voltage insulator 33, for example made of alumina or sapphire, that mechanically supports the electrical conductive tip 34 which forms the gas field ion emitter. The central tubular insulator 33 provides over 30 kV of electrical isolation with respect to the base platform 31. This central insulator 33 has one or more openings for connection of high voltage leads 35, 36 connected to the conductive tip 34 for providing the high voltage for operating the tip 34 as a gas field ion source and also to supply a heating current for heating the tip 34.

Also attached to the base platform 31 is an outer tubular and cylindrical insulator 37 that surrounds the central insulator 33. The outer tubular insulator 37 mechanically supports an extractor electrode 38 and provides also more than (over) 30 kV of electrical insulation.

The extractor electrode 38 is designed with a small hole 39 (e.g. 1 mm, 3 mm, 5 mm diameter) that by design is a small distance (e.g. 1 mm, 3 mm, 5 mm) from the apex of the tip 34. Together the base platform 31, the central insulator 33, the outer cylindrical insulator 37 and the extractor electrode 38 define an inner gas confining vessel 41. The vacuum conduction or pumping speed through the hole 39 of the extractor electrode can be relatively small to support a relative high pressure in the region of the electrically conductive tip 34 compared to the region outside the inner gas confining vessel 41. The only passages for gas to escape are the aforementioned extractor hole, and a gas delivery path 40, and a pumping valve 42. The gas delivery path is through a small tube 40 that passes from a supply bottle to the interior gas confining vessel 41 through the grounded base platform 31. The pumping valve 42 can be mounted on the base platform 31, or integrated into the gas delivery path 40.

All of the above mentioned components of the charged particle source are supported on the base platform 31 that is mechanically supported by a stiff yet thermally non-conductive support structure (not shown) that mounts to the upper portion of the exterior vacuum vessel (15 in FIG. 1). The upper portion of the exterior vacuum vessel is allowed to tilt to a small angle up to 5 degrees by the interface of a concave spherical surface with a corresponding convex spherical surface in the lower external vacuum housing (16 in FIG. 1).

Within the inner gas confining vessel an ion getter 45 is arranged. Improved vacuum in the inner gas confining vessel is attained with the inclusion of chemical getters 45 in the interior of the gas confining vessel 41. These chemical getters 45 are activated at the time of baking the gas field ion source. During the heating of the chemical getters 45 to a temperature of about 200° C. for 2 hours and upon cooling these components the chemical getters 45 leave many chemically active materials, such as Zr, V, Fe and Ti, etc., that serve to effectively pump many spurious gas species. The getters can be coated directly onto the surfaces of existing parts, for example the outer cylindrical isolator 37, or they can be ribbon like materials that are attached to the interior surfaces forming the inner gas confining vessel. The pumping speed of the chemical getters for hydrogen is of importance since among the likely impurities, hydrogen is not effectively cryo-pumped by the surfaces cooled to cryogenic temperature. These chemical getters 45 in the inner gas confining vessel 41 are also very effective for further purification of the delivered helium and neon gases. Being noble gases, the helium and neon are not affected, but all impurities will be effectively pumped. During their periodic regeneration, the evolved gases can be pumped away in an improved manner by opening the purpose-made bypass valve 42 (flapper valve) that connects the inner gas confining vessel 41 to the exterior gas containment 81.

The inner gas confining vessel 41 can be surrounded by a radiation shield which minimizes the radiative heat transfer from the exterior vessel walls (at room temperature) to the ion source. The inner gas confining vessel 41 also can contain an optically transparent window that allows a direct line of sight onto the tip 34 of the emitter from outside the inner vacuum vessel. An aligned window in the exterior vacuum vessel allows a camera or pyrometer to observe the emitter tip of the gas field ion source. Such a camera can inspect the source, or monitor its temperature during the periodic maintenance. One or both of these windows can include leaded glass to minimize radiation transfer of X-rays from the interior to the exterior. The base platform 31 due to its high thermal conductivity is also well suited for a temperature sensor such as a thermocouple.

As further described later in more detail, the gas supply tube 40 can comprise a heater 73*a*.

The gas field ion source is operated at a voltage that is established based upon the geometrical shape of the emitter tip, 34. The geometrical shape includes factors such as the average cone angle, and the average radius of curvature of the emitter tip 34.

The above mentioned design has the advantage of a small mass, and a small volume. These both allow for faster thermal cycling and reduced cooling load, and reduced cost, and reduced complexity. In addition, the compact design allows a quick change of the noble gas with which the gas field ion source is operated. Especially the compact design of the inner gas confining vessel 41 allows a quick change between operating the gas field ion source with helium and operating the gas field ion source with neon.

Under ideal operation conditions, the apex of the emitter tip 34 is roughly spherical (e.g. with a diameter of 50, 100, or 200 nm.) The spherical surface is in fact better described as a series of planar facets that approximate a sphere. Near the apex of the tip 34 of the emitter, the end form is better approximated by three planar facets that intersect at a single vertex forming a three sided pyramid. The pyramid edges can be relatively shallow angled (e.g. 70 or 80 degrees with respect to the axis of the emitter). The ridges and the apex of the pyramid are somewhat rounded at the atomic level so that there are no single atom ridges or that there is not a single atom at the apex.

Under ideal operation conditions there are three atoms of the emitter material at the apex which form an equilateral triangle. These three atoms, hereinafter called the "trimer", protrude the most, and hence produce the largest electric field when a positive voltage (e.g. 20 kV, 30 kV, 40 kV) relative to the extractor electrode is applied to the tip. In the presence of helium or neon gas, the neutral atoms can be field ionized just above these three atoms. At relatively high gas pressures (at local pressures of $10^{-2}$ Torr, or $10^{-3}$ Torr) the ionizations can happen at rates of $10^6$ or $10^7$ or $10^8$ ions per second. Under the ideal circumstances, this steady stream of ions is constant over time and persists indefinitely.

In reality, under typical conditions when operating with helium, the ion emission can represent 100 pA of emitted current, and it can persist for 10 or more continuous days, and show up and down fluctuations that are on the order of 0.5% over timescales of ms or faster. Gradual loss of emission current can progress at a rate of 10% per day if uncorrected. The helium performance (or the performance of operation with helium) is somewhat impacted by the purity of the gas which can be 99.9990%, or 99.9999% purity or even better and the quality of the base vacuum in absence of helium typically is $2 \times 10^{-9}$ Torr, $1 \times 10^{-9}$ Torr, $5 \times 10^{-10}$ Torr or even better.

To the extent that in this specification the unit Torr is used it can be substituted by mbar.

When the gas field ion source is operated with Neon there are several complications compared to the situation when the gas field ion source is operated with helium. In part, the neon ions are much more massive and hence able to cause sputtering at a rate that can be 50 times more than helium. As the neon ions strike nearby surfaces, the sputtered atoms can be negatively charged (e.g. negative secondary ions) and as such they can be back accelerated to the emitter 34 and cause the emitter 34 to be damaged. In part, neon gas is not commercially available (e.g. in compressed gas bottles) with the same levels of purity in which helium gas is commercially available (e.g. 99.9999% pure). The effect of these impurities is discussed later. But most significantly, when the emitter 34 is operated with neon, the emitter 34 should be operated at a somewhat reduced voltage. For example, if 40 kV is optimal for helium, the same emitter tip will give an optimal emission current of neon at 30 kV. At this reduced voltage, the electric field is similarly reduced, and spurious atoms (residual gases from the imperfect vacuum, or impurities in the gas supply) are able to reach the emitter 34 at a much higher rate. The mere 25% reduction in field strength seems to allow an exponentially larger number of these spurious atoms (not helium and not neon) to reach the emitter. These spurious atoms (e.g. $H_2$, $N_2$, $O_2$, CO, $CO_2$, $H_2O$, etc.) can disturb the availability of neon to reach the tip of the gas field ion source, and hence causes emission instability both on the short and on the long time scales. The spurious atoms can also facilitate the etching of the emitter material causing it to gradually change its shape over time which can reduce the ion emission current gradually and can reduce the optimal operating voltage gradually. The spurious atoms can also cause one or more of the atoms of the emitter tip 34 to be more readily field evaporated causing abrupt emission drops.

In order to produce a stable neon beam, or a beam of noble gas ions having atoms of a mass larger than neon, the composition of the extractor electrode is quite important. Especially the surface that faces the emitter is important. The tip 34 of the gas field ion source is configured to be quite close to an adjacent extractor electrode 38 with a small hole 39 in it. The tip of the ion source 34 and the extractor electrode 38 have voltages applied to them. The difference in voltages gives rise to an electric field which is quite large near the apex of the emitter tip 34. The composition of the extractor electrode 38 is made of a material that is not appreciably sputtered with the neon beam and does not form negative ions, for example carbon, iron, molybdenum, titanium, vanadium, tantalum. Also, the composition of the surface of the extractor electrode 38 facing the tip 34 is made of a material that is readily cleanable, and with a low outgassing rate for ultra high vacuum (e.g. stainless steel or oxygen free copper). The surface can also have a smoothness (realized by mechanically polishing or electropolishing) to produce a mirror like finish, especially the surfaces that are nearest to the tip 34 of the emitter. Also the material of the surface of the extractor electrode 38 facing the emitter tip 34 can have a very low negative secondary ion sputter yield (e.g. gold and other materials free of oxides, nickel). The low sputter yield for negative secondary ions reduces the frequency with which negative secondary ions are created which can be accelerated back to the emitter to cause damaging it (or to cause damaging impacts). The secondary electron yield can be as low of $10^{-5}$ per incident neon ion.

In order to produce a stable neon beam, the exact shape of the extractor electrode 38 is very critical for several reasons. In particular the shape of the extractor hole 39 is critical. There are several design criteria for the hole in the extractor and the optimal shape is a balance of several conflicting needs. First, to confine the ionizing gas (helium or neon), the hole should be relatively small so that the noble gas is maintained at a relatively high pressure in the range between $10^{-2}$ torr and $10^{-3}$ torr in the inner gas confining vessel 41 near the apex of the emitter tip 34, and allow the pressure to drop significantly into the range between $10^{-5}$ torr and $10^{-7}$ torr outside the inner gas confining vessel 41. Reducing the pressure outside the inner gas confining vessel 41 is critical to minimize the rate at which the desirable high energy ions scatter off of the low energy neutral gas atoms. The scattering can give rise to undesirable beam tails, and even allow some ions to become neutralized. It is thus the vacuum conductance of the hole 39 in the extractor electrode 38 that is critical. Vacuum conductance is measured in liter per second and is a standard measure for determining how the pressure falls off from one side of a hole 39 (the interior) to the other side of a hole 39 (the exterior).

Also, if the hole 39 in the extractor electrode 38 is too large, the emitter tip 34 of the gas field ion source will be radiatively exposed to warmer surfaces. The emitter tip 34 of the gas field ions source and the extractor electrode 38 are maintained at cryogenic temperatures in the range between −210° C. and −190° C. If the hole 39 in the extractor electrode 38 is too large then the emitter tip 34 of the gas field ion source will become warmed-up by larger surface areas that are not cryogenically cold, but are instead at room temperature (e.g. +20° C.). Generally, the cryogenically cold surfaces are effectively trapping spurious gas atoms, and warm surfaces do not effectively trap gas atoms.

There are however contrary reasons for which it is desirable that the hole 39 in the extractor electrode 38 not be too small. For example, if the hole 39 is too small it becomes a challenge to manufacture and keep this hole clean to the levels to support the high vacuum and high electric fields in which it functions. Also, the tip 34 of the emitter should be centered relative to the hole 39 in the extractor electrode 38 within 10% of the diameter of the extractor hole 39. Thus, if the hole is too small, it becomes difficult to position it in a symmetric fashion with respect to the tip 34 of the emitter.

Also, the angular size of the extractor hole cannot be too small with respect to the apex of the tip 34 of the ion emitter. Expressed another way, the solid angle of the extractor hole 39 as seen by the tip 34 of the emitter is a certain size. This stems from the pattern of the ion emission. The tip 34 of the emitter itself tends to emit ions with a fairly narrow cone, with a half cone angle of 2 degrees. However, it is common to have extraneous emission at significantly larger angles. The nature of the shape of the emitter is that high extraneous emission at a 20 degree angle relative to the axis of the emitter is quite common. And it is desirable that these emitted ions do not strike the extractor electrode 38 to avoid damage to the extractor electrode 38, or the production of negative secondary ions that would damage the tip 34 of the emitter. Also, the extraneous ion emission could serve to desorb any adsorbates that might transfer to the emitter and cause unstable ion emission from the tip of the emitter. Thus, the angular size of the hole 39 in the extractor electrode 38 and the distance between the tip 34 of the emitter and the extractor electrode 38 is selected so that the angle of the hole is about or greater than 20 degrees in angle.

It is recognized to be of some importance that the interior gas confining vessel 41 has a very good base vacuum, or equivalently, is very free from spurious adatoms (e.g. the atoms and molecules other than the desired operating noble gas such as helium or neon), Such spurious atoms and molecules can be $H_2$, $N_2$, $H_2O$, $O_2$, CO, NO, $CO_2$, etc. By way of explanation, the pressure of the base vacuum in the inner gas confining vessel 41 is the pressure that would be measured within the inner gas confining vessel when the supply of gases to the inner gas confining vessel, especially the supply of helium and neon gases, are turned off. The desired pressure would be $10^{-10}$ torr or better. At a pressure of $4 \times 10^{-10}$ torr, while the background gas pressure is low, it would take about 1 hour for an initially clean surface to be covered by spurious adatoms to a thickness of one monolayer. Such adatoms cause instability of the ion source. Thus, it is intended to attain the best possible base vacuum. Towards this end, the entire housing of the gas field ion source is configured to be cleaned according to Ultra High Vacuum (UHV) practices. And the interior gas confining vessel 41, where the tip 34 of the gas field ion source is housed, is configured and prepared for UHV service.

Figure 4:
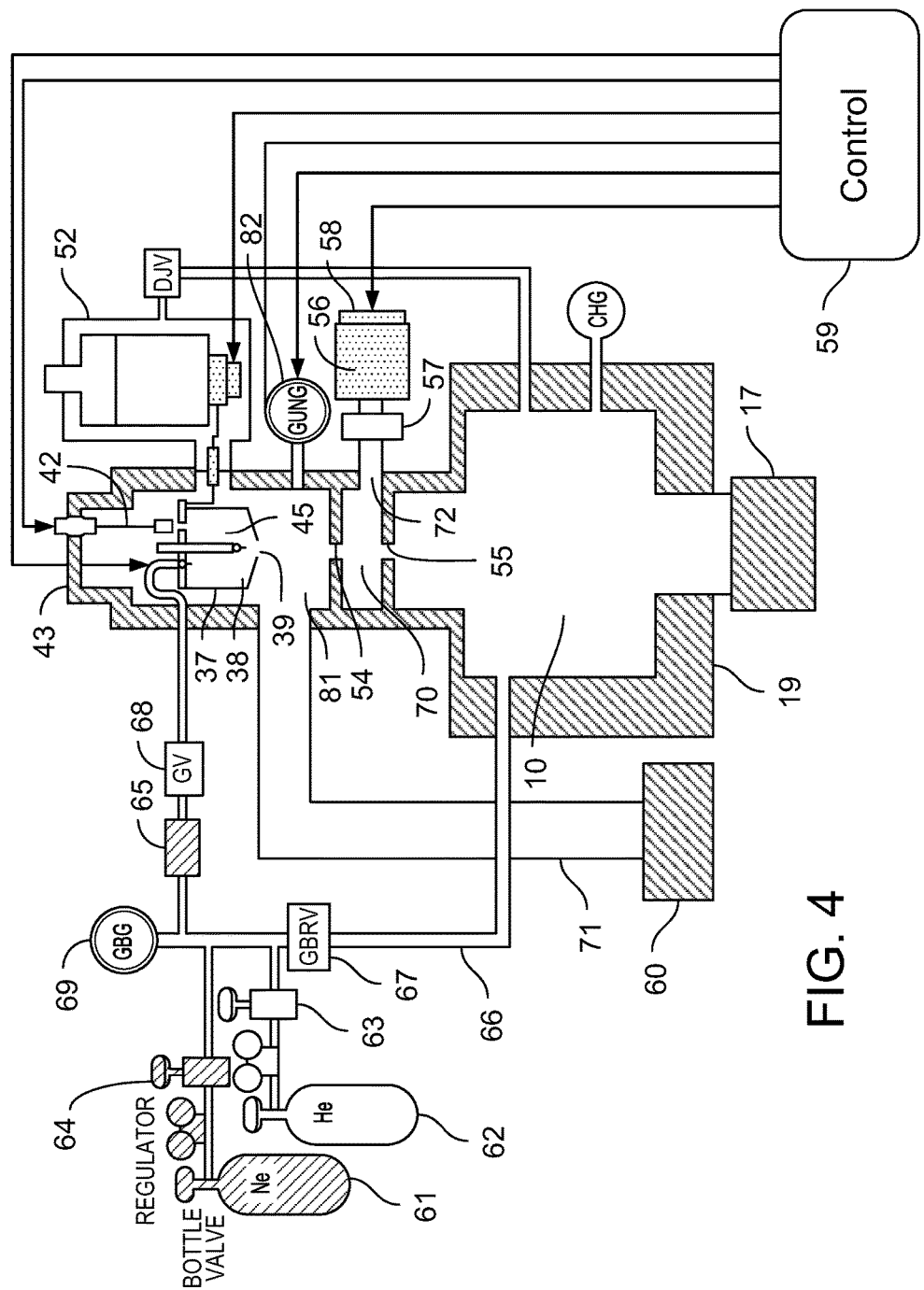
FIG. 4 shows a sketch of the charged particle beam system including a vacuum system.

FIG. 4 shows the principles of a gas field ion microscope that can be operated with two different noble gases for the ion beam, in this particular case either with helium or with neon. The gas field ion microscope has three vacuum regions, within the microscope's housing 19. The first vacuum region is the sample chamber 10, the second vacuum region is the mid column region 70 and the third vacuum region is the outer vacuum containment 81 in which the gas field ion source is housed. The mid column region 70 is positioned between the outer gas containment 81 and the sample chamber 10.

As described before, the sample chamber is evacuated by a turbo molecular pump 17 which is mounted on table 5 (not shown in FIG. 4). The outer gas containment 81 also is evacuated by a mechanical pump 60 which also can be a turbo molecular pump which also can be mounted on table 5. The connection between the mechanical pump 60 evacuating the outer gas containment 81 can be designed like the connection between pump 17 and the sample chamber, i.e. the connection between pump 60 and the outer gas containment 81 also can comprise two flexible bellows with a stiff tube or a compact vacuum flange between them.

The mid column region 70 is separated from the outer gas containment 81 by a first pressure limiting aperture 54. In a similar manner the mid column region 70 is separated from the sample chamber 10 by a second pressure limiting aperture 55. The mid column region 70 is evacuated by an ion getter pump 56. This provides the advantage that ion getter pump 56 does not generate any vibrations.

Ion getter pump 56 is connected to and controlled by a control 59. Control 59 operates ion getter pump 56 in a manner that ion getter pump 56 is switched-off at any time at which the gas field ion source is operated and/or noble gas is supplied to the inner gas confining vessel 41.

The ion getter pump 56 evacuating the mid column region 70 is attached to the mid column region via a flange 72. In flange 72 a valve 57 is provided which can be closed if the ion getter pump 56 needs to be exchanged or otherwise serviced or if the ion getter pump is switched off or if the ion getter pump should not evacuate the mid column region 70. In this manner, exchange or servicing of ion getter pump 56 is possible without venting the mid column region 70.

Ion getter pump 56 comprises a heater 58 which also is connected to and controlled by control 59. By the heater 58, the ion getter pump 56 can be heated to release noble gas and other adsorbates from the ion getter pump 56 to clean it.

The outer gas containment 81 comprises a pressure measuring device 82 which also is connected to control 59. The control 59 is configured, for example by a computer with a software program, that only switches ion getter pump 56 on if the pressure within the outer gas containment 81 is below a predefined pressure value, i.e. when an output signal of pressure measuring device 82 indicates a pressure in the outer gas containment 81 below the predefined pressure value. In this manner the life time of ion getter pump 56 can be extended.

As already described above in connection with FIG. 3, within the outer gas containment 81 the gas field ion source is arranged. In FIG. 4 only that components of the gas field ion source are shown which form the inner gas confining vessel 41, i.e the base platform 31, the outer tubular insulator 37, and the extractor electrode 38 with the extractor hole 39. Also shown in FIG. 4 is the getter 45 within the inner gas confining vessel 41.

Also shown in FIG. 4 is the flapper valve 42 with its drive 43 which also is connected to and controlled by control 59. Flapper valve 42 can be opened by its drive 43 if a quick evacuation of the inner gas confining vessel 41 is desired, for example if a change of operation of the gas field ion source between operation with helium to generate a helium ion beam and operation with neon to generated a neon ion beam is desired.

The gas field ion microscope comprises a cooling device, for example a dewar 52 with which the emitter tip as well as gas supply tube 40 and the base platform 31 are cooled. Not shown in FIG. 4 is the thermal connection between dewar 52 and the cooled components like the base platform 31 or the gas supply tube 40. The dewar 52 comprises a vacuum jacket to insulate the inner chamber of the dewar configured to be filled with a cryogen from the outer world. Via a dewar jacket valve and a vacuum line the dewar jacket is connected to the sample chamber 10. In this way the vacuum in the vacuum jacket can be maintained at the pressure of the sample chamber. The dewar jacket valve can be closed if any process gases are supplied to a sample positioned in the sample chamber, if the chamber is vented, or generally whenever the chamber pressure is above a predefined pressure value, of for example $10^{-6}$ torr. By closing the dewar jacket valve accumulation of condensible gases in the dewar jacket can be avoided.

The gas supply system of the gas field ion beam system shown in FIG. 4 comprises two gas bottles 61, 62, one comprising helium and one comprising neon. Both gas bottles have a pressure regulator to ensure a constant gas pressure in the gas supply line after the pressure regulator. Following in both gas supply lines after the pressure regulators each gas supply line comprises a leak valve 63, 64. The leak valves 63, 64 ensure a constant gas flow of the respective noble gas from the gas bottle 61, 62 to the tube 40, and accordingly into the inner gas confining vessel 41.

In the direction of gas flow from the gas bottles 61, 62 to the tube 40 both gas supply lines are connected. Following in the direction of gas flow, in the combined gas supply line a purifier 65 and a gas valve 68 follow before the gas supply line is connected to tube 40 which terminates in the inner gas confining vessel 41.

The gas supply line comprises a bypass line 66 with a bypass valve 67 to directly connect the gas supply line with the vacuum chamber 10.

Furthermore a heater 73*a* is provided on the gas supply tube 40 with which the gas supply tube 40 can be heated.

When operating the gas field ion beam system for several days with high helium or neon gas flows, the operation of the gas field ion source can include a step of allowing the cryo-pumping surfaces, i.e. the base platform 31, the gas supply tube 40, the extractor electrode 38, the insulators 33, 37 and the emitter tip 34 to warm up briefly. As a result of this warming-up the accumulated cryo-adsorbed atoms can be desorbed and then pumped away via the turbo-molecular pumps 17, 60. Also the gas delivery tube 40 which supplies the noble gas like helium or neon gases from the external gas supply bottles 61, 62 to the proximity of the emitter tip 34 can be cryogenically cooled. This serves to purify the supplied gases by allowing impurities, such as $H_2O$, $CO$, $CO_2$, $N_2$, $O_2$, etc., to be cryo-pumped onto the tube's 40 surface. To clean the surface of the tube 40 of the gas supply, it can be periodically heated to a high temperature by heater 73*a* similar as the other cryo-pumping surfaces can be heated by heater 73*c* to a temperature of at least 100° C., more preferable to 150° C. or even 200° C., to allow these accumulated adsorbates to be released and pumped away via the turbo pumps 60, 17.

The gas delivery tube 40 has an inner diameter that is between 1 mm and 6 mm. The gas delivery tube 40 connects the external gas delivery system through the walls of the external gas containment 81, all the way to the internal gas confining vessel 41. The gas delivery tube 40 has a bypass valve 67, to facilitate the exhausting of the desorbed gases. The bypass valve 67 prevents the desorbed gases from being largely trapped in the inner gas confining vessel 41. The bypass valve 67 can be completely external to the vacuum housing, or integrated into the inner gas confining vessel 41.

It has turned out that it is advantageous to periodically clean the emitter tip of adsorbed adatoms by one of three techniques. One of the three techniques is to periodically heat the emitter tip 34 while keeping the components forming the inner gas confining vessel 41 at cryogenic temperature, for example to a temperature of 300° C. or more for a time of 1 minute or more. This heating of the emitter tip 34 can cause the accumulated adsorbed atoms to be thermally excited so that they desorb and transfer to less critical surrounding surfaces. Those surfaces, primarily the surface of the extractor electrode 38 being cold, will hold the adatoms and reduce the likelihood of being transferred back to the emitter tip 34.

Alternatively, instead of heating the emitter tip 34 it is possible to use an intense light focused on the emitter tip to cause the accumulated adsorbed atoms to be photo-desorbed and hence leave the emitter tip 34 clean and suited for stable ion emission.

As a further alternative, it is possible to increase the voltage difference between the emitter tip 34 and the extractor electrode 38 so that the electric field causes the accumulated adatoms to be desorbed. For example, if the voltage difference between the emitter tip 34 and the extractor electrode during operation of the gas field ion source is nominally 30 kV for neon emission, the field can be increased to 32 kV, more preferably to 35 kV or 40 kV, to cause the adsorbates to be removed.

The needs for one of these three above described techniques can be appraised by observing the emission pattern and seeing the effect of the individual adsorbates. Or the needs for one of these three techniques can be appraised by observing any unstable emission from the tip 34 of the emitter.

Figure 11A:
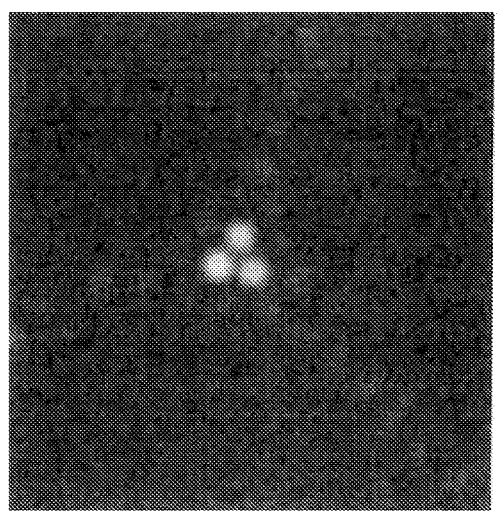
FIGS. 11a and 11b show images of a gas field ion source emitter tip.
Figure 11B:
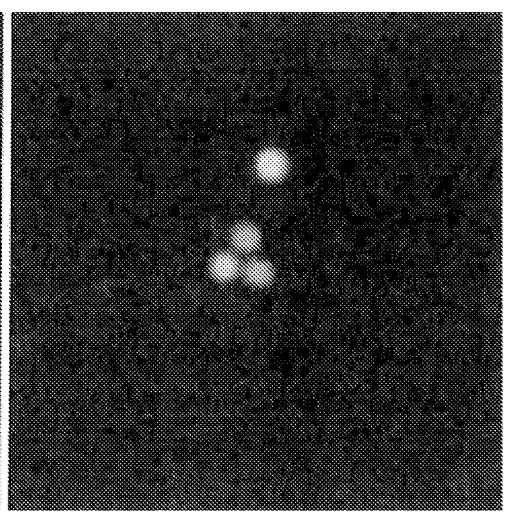

Respective field ion microscopic images of the emitter tip are shown in FIGS. 11a and 11b. FIG. 11a shows the central trimer emission pattern. The trimer atoms are brightest, but emission from non-trimer atomic emission sites are also visible. Nominally, the gun tilt is adjusted so that one of these three central emitted beams is aimed down the ion column. During ideal operation, the emission pattern is very stable and constant over time. However, due to non-ideal vacuum conditions, or gas purity, an undesired atom or molecule can be adsorbed onto the emitter as show as a larger bright spot in FIG. 11b. These emission patterns can be regularly monitored to look for changes from such adsorbed molecules or atoms. The undesired adatom can be located on the trimer atoms, or on one of the non-trimer atoms, or at a different location. The effect of the adsorbate is that the emission current from the trimer will be reduced or increased while the adsorbate continues to reside there. Therefore, the techniques described can be applied until the adsorbate is removed, and the emission pattern is resorted to the original and desired appearance.

As described above, small amounts of spurious gas atoms that arrive at the emitter tip of the gas field ion source can cause the emitted beam to fluctuate up and down in intensity or diminish gradually and progressively. These effects can be diminished by a gas manifold (or gas delivery system) that is designed for the purpose and operational procedures that optimize performance. The gas delivery system includes a bypass valve that allows the gas delivery lines to be evacuated as a cleaning process in preparation to their use with helium or neon gas. The gas delivery hardware is prepared with materials and methods that are well established for UHV service. The gas delivery system is equipped with integrated heaters that can heat the gas manifold to high temperatures such as 150° C., 200° C. or even 400° C. for long periods of time in the range of 8 hours, 12 hour, or even 16 hours to help to desorb any vacuum contaminants. During this heating time, a valve 68 in the line to the inner gas confining vessel 41 is closed, and a bypass valve 67 in a pipe 66 leading to the sample chamber 10 is opened. As a result, the evolved gases are pumped away to the sample chamber 10 where their impact is not significant. The baking process can be repeated after the gas manifold is vented to atmosphere (e.g. after a service activity such as a bottle replacement, or a valve replacement) or when the level of emission stability needs to be improved. A chemically active purifier 65 can also be incorporated as a part of the gas manifold to reduce common impurities. The purifier can be operated hot at 100° C., 200° C. or even 300° C. or at room temperature or any desired temperature by way of a dedicated heater for the purifier. The purifier's heater can be powered by DC power so that there is no interference from the 60 Hz or 50 Hz magnetic fields. The gas manifold also can comprise a pressure gauge 58, to monitor the pressure downstream from of the precision leak valves, but before the gas is delivered to the inner gas confinement.

The inner gas confining vessel of the gas field ion source has a built in valve, the "flapper valve" 42 that, when opened, connects the inner gas confining vessel 41 with the outer gas containment 81 and allows the pumping speed of the volume of the inner gas confining vessel to be increased from about 1 liter/sec (when the only opening is through the extractor hole 39) to 22 liter/sec when the additional valve is open. Use of this valve can help to achieve a low base pressure which can help with the stable neon emission. Use of this valve can also speed up the time to purge one gas (e.g. helium) before switching to another gas (e.g. neon). The valve can be mounted directly to the inner gas confining vessel, or it can be located more remotely. The valve can also be incorporated into the gas delivery line 40.

A cryogenic connection can be provided that also serves as a gas delivery tube from the gas supply bottles to the inner gas confining vessel. The benefit is that there are fewer connections to the inner gas confining vessel, and for service the connection and disconnection is easier. Another benefit is that the gas path is suitably cold to provide cryo-pumping of any impurities in the helium or neon gas. Another benefit is that the gas delivery tube will be suitably heated to desorb the impurities when the dewar is heated.

The inner gas confining vessel can be both heated and cooled through a flexible thermal conductive element 32 (shown in FIG. 3). The terminal end of the flexible thermal conductive element is a heater mounted to a cryogenic cooler. When the dewar is filled with a cryogen it serves to keep the gas field ion source cool. When the dewar is not filled with a cryogen, the heater can be powered to heat both the dewar and the components forming the inner gas confining vessel. This design is especially favorable since the dewar and the inner gas confining vessel are thermally intimate and it is not a simple matter to achieve a temperature difference between them. During the baking of both of these parts, the power is about 25 watts, and the achieved temperature is 130° C. on the dewar, and 110° C. of the components forming the inner gas confining vessel 41.

To reduce charging artifacts in images due to charging of the sample, a flood gun providing an electron beam can be provided which allows a relatively high energy in a range larger than 1 keV, larger than 1.5 keV, or even larger than 2 keV. Higher energies are desirable for many samples to better mitigate charging artifacts.

As a way of reducing the effect of vibration on the image quality, one or more turbo molecular pumps are replaced by ion getter pumps. The turbo molecular pumps are generally expensive. And due to their internal rotating parts, the turbo-molecular parts tend to impart vibrations to the charged particle beam system and degrade the image quality. One way to reduce costs and to eliminate turbo-vibrations, is to replace one or more of them in favor of a getter ion pump (aka ion pump). The getter ion pumps (or ion getter pumps) rely upon two pumping mechanisms. The first method is chemical gettering to pump chemically active species. The second method is to directly bury atoms. The second method works for any gas molecules including noble gas atoms while the first method does not work for noble gas atoms because they are chemically inert. The gettering effect is achieved by bonding of an active species to a reactive material which commonly is a combination of titanium or tantalum and that is freshly evaporated by the getter ion pump. The direct burial is achieved by ionizing the molecule (by electron impact) and accelerating the resulting ion with a large electric field to an energy of 3 keV or 5 keV, or 10 keV. The ion then strikes an adjacent surface (titanium or tantalum) and is implanted into it to a typical depth of 10 to 100 nm. Upon burial, the gas species is no longer available to return to the vacuum vessel. Accompanied by the direct burial is a sputtering effect in which chemically un-reacted titanium or tantalum molecules are sputtered away to become available for subsequent chemical gettering. The ion pumps however are known to be of limited pumping speed for noble gases such as helium and neon because (1) they are chemically relatively inert and thus are most effectively pumped by direct burial, and (2) they are not easily ionized owing to their high ionization energies, and (3) they can gradually diffuse out of their buried states owing to their mobility, and the progressive erosion of the surface. To overcome the draw-back of limited life times of ion getter pumps in a noble gas environment they can be switched off when the gases present are primarily noble gases, such as when the gas field ion source is operating. Alternatively, the getter ion pump can work in conjunction with a turbo pump wherein, the ion getter pump evacuates only a small intermediate vacuum space in the charged particle beam column and the gas load to the ion getter pump is limited by a diaphragm.

Figure 6:
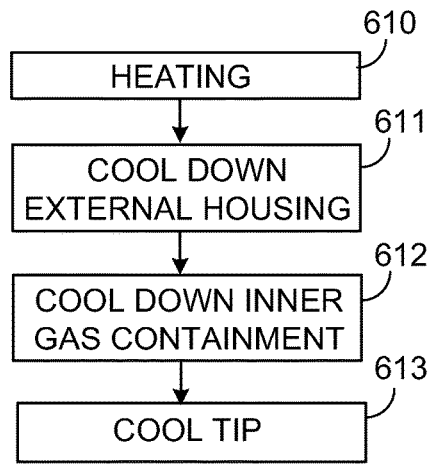
FIG. 6 shows a flow chart showing various steps in cleaning processes of a gas field ion source operated with a noble gas such as neon.

When baking out the gas field ion source to attain the desired vacuum levels, it is useful to follow a specific time ordering as describes with reference to FIG. 6. In a first step 610 the external vacuum housing, and the inner gas confining vessel 41, and the emitter tip of the gas field ion source all are heated to a high temperature of at least 100° C., more preferable 150° C. or even 200° C. This heating can take place concurrently for all components. However when the heating process is completed at first in a step 611 the external vacuum housing is allowed to cool to room temperature. During the time when the external vacuum vessel cools down, the inner components such as the inner gas confining vessel 41 and the emitter tip of the gas field ion source are continued to be heated. Then, after the external vacuum housing has cooled down to room temperature in a step 612 the components forming the inner gas confining vessel are cooled to cryogenic temperatures while the heating of the tip 34 of the gas field ion source is still continued. Then, at a final step 613, after the components forming the inner gas confining vessel have been cooled to a cryogenic temperature, the heating of the ion emitter is discontinued so that the tip 34 of the gas field ion source is maintained to a cryogenic temperature. Other temperature versus time schemes can cause the tip of the gas field ion source to adsorb materials as they desorb from the surrounding surfaces.

Control 59 can be configured, for example by a respective software code, to control the various heaters 73*a*, 73*b*, 73*c*, 58 and the heating current through the supply lines of the emitter tip to ensure the above heating and cooling scheme.

Beam landing errors which can be evident as image vibrations can be reduced for example by eliminating the time varying magnetic and electric fields that cause the ion beam to land in the wrong location. Generally electron and ion microscopes are powered by the standard 60 Hz and 50 Hz electric power systems. These "AC" power sources inadvertently create small ripple voltages on the beam controlling electronics and these can cause undesired beam landing errors. For example, 5 mV of 60 ripple on the beam steering electrode will cause the beam to miss its desired target in a time varying way. Alternatively, the "AC" power sources can produce magnetic fields that can exert a force directly on the charged particle beam, giving rise again to time-varying landing errors. For example a 50 Hz magnetic field at amplitude of 5 milligauss can cause a time varying landing error of more than 1 nm. Commonly, these "AC" power sources provide power to the individual components that comprise and support the microscope. Examples include the turbo-pumps, the ion pumps, the vacuum gauges, the heaters, the mechanical stage motors, the high voltage power supplies, the filament heater, pico-ammeters, chamber illuminators, detectors, electron flood gun, the camera, DC low voltage power supplies, etc. Most of these systems are not available except with AC power inputs. In other words the equivalent DC powered equivalents are generally not commercially available. However, it has shown to be desirable to design the gas field ion microscope with no AC powered components sources (50 Hz or 60 Hz) within 3 meters of the microscope. This can be achieved by two methods: First, all components that are located within 3 meters of the microscope can be designed, specified, or modified to operate with only DC electrical power, or pneumatic actuators. Second, the few items that involved AC power with no alternatives available (e.g. the DC power supplies) can be located remote from the microscope by at least 2 meters, more preferable more than 3 meters. For example, the gas field ion microscope can have the high voltages generated locally by DC to DC transformers. Some heating elements are operated by DC power. And some AC heaters can be used if they can be shut off when operating the microscope. The customers can choose to located the operator console (with its own AC powered computer and monitor) near or far to the microscope as they prefer.

The sample stage 20 within the sample chamber 10 has a 5-axis, motor controlled stage with high repeatability (less than 2 microns), low drift (less than 10 nm/minute), and low vibration (<1 nm). The stage axes are (in order from chamber's mounting surface 19 to the sample): Tilt, X, Y, Rotation, and Z. The tilt axis can tilt the sample from a limit of −5 degrees to 0 degrees (where the gas field ion source beam strikes it orthogonally) to +54 degrees (where a gallium beam strikes the sample orthogonally) to a limit of +56 degrees. To achieve this large tilt range with all the weight of all the superior axes, involves a substantial torque with minimal net force. This tilt axis is driven with a conventional DC or stepper motor external to the vacuum, with a hermetic rotary feedthrough. All superior axes are actuated by piezo ceramic actuators that provide very high stiffness (to reduce vibration) and an inherent breaking when not powered.

Figure 5:
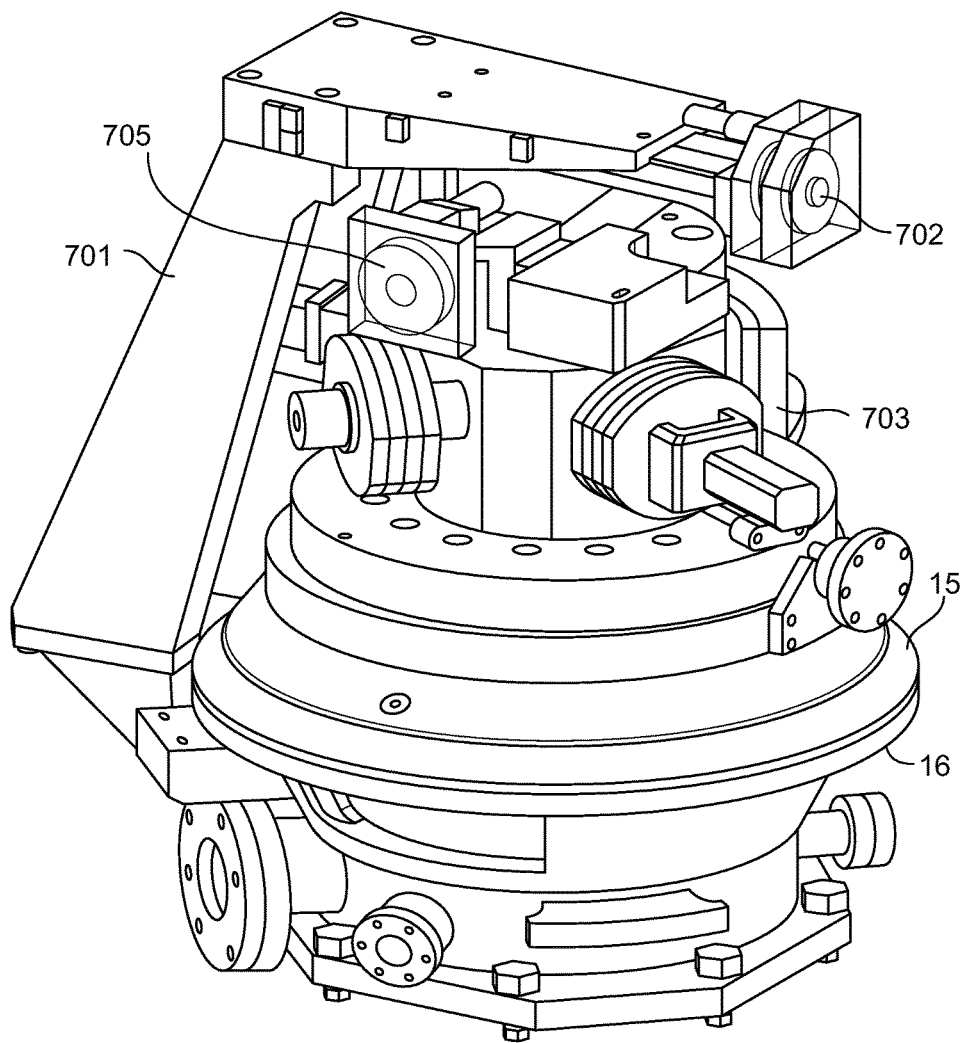
FIG. 5 shows a three dimensional representation of an outer housing of a gas field ion source.

The gas field ion source is tilt-able by a motorized mechanism as shown in FIG. 5. The mechanism is designed so that when the motion is complete, vibrations are reduced by disengaging the drive mechanism. By way of explanation, the gas field ion source can be tilted by small angles (typically 1, 2, or 3 degrees in X and Y directions) to align the ion source with respect to the column. In part, this tilt is involved when the exact shape of the emitter is not readily controlled. In part, this tilt can be involved because usually three ion beams emanate from the apex of the emitter with an angular separation of about 1 degree.

One of the emanating ion beams can be aimed down the axis of the ion column for best performance. The tilting of the gas field ion source allows for this aiming of the chosen ion beam. As described above and also shown in FIG. 5 the housing of the gas field ion source comprises two parts, an upper part 15 and a lower part 16, The upper part 15 of the housing is constrained to tilt by way of a concave spherical surface that mates with a corresponding convex spherical surface on the fixed lower portion 16 of the housing. The central point of the spherical surface is arranged so that it is coincident with the position of the apex of the emitter tip, thus providing a tilt motion that is concentric with the apex of the emitter tip. The interface of the upper and lower spherical surfaces provide sufficient friction to make the two pieces mechanically quite rigid and free from any measurable relative vibration.

In the system as shown in FIG. 5, the tilt of the upper housing 15 relative to the lower housing 16 is achieved with a motorized tilt mechanism. The tilt drive mechanism is achieved by a fixed gantry 701 fixed to the lower housing 16 that moves a peg that fits within a receptacle in the upper portion 15 of the housing. As the peg is moved by two orthogonal axes of motors 702, 703 (for X- and Y-tilts), it makes contact with the edge of the receptacle and causes the upper housing 15 to move in the desired direction. This relative tilting of the two spherical surfaces is enabled again by the actuation of an air bearing. After the desired tilt is achieved, and the air bearing is disabled, the peg is moved in a retreating direction so that it is no longer in contact with the edge of the receptacle. In this way, the motorized axes (and the vibrations they may introduce) are completely disengaged when the motion is no longer desired. Thus, the motors 702, 703 provide the tilting effect when desired, but are disengaged when their service is complete. Also it is worth noting that the upper housing 15 (the tiling part) is equipped with a inclinometer 705 that provides a precise measurement of the tilt of the upper housing 15 relative to direction of the gravitational force. The inclinometer provides the tilt angle in two directions (in X and Y direction) to the operator and to the control that controls the gun tilt motors. This allows the tilt of the upper housing, and accordingly the ion gun tilt to be repeatedly moved from one position to another and back again. The inclinometer 705 also prevents excessive tilt angles (e.g. +3 degree in X and +3 degrees in Y) that could damage the internal parts (which may be limited to just 4 degrees total tilt from vertical). Also, it allows the upper housing 15 to be restored to a standard tilt angle when it is desirable to execute the periodic source maintenance which relies upon the fixed camera vantage and fixed electrical contacts.

Figure 7:
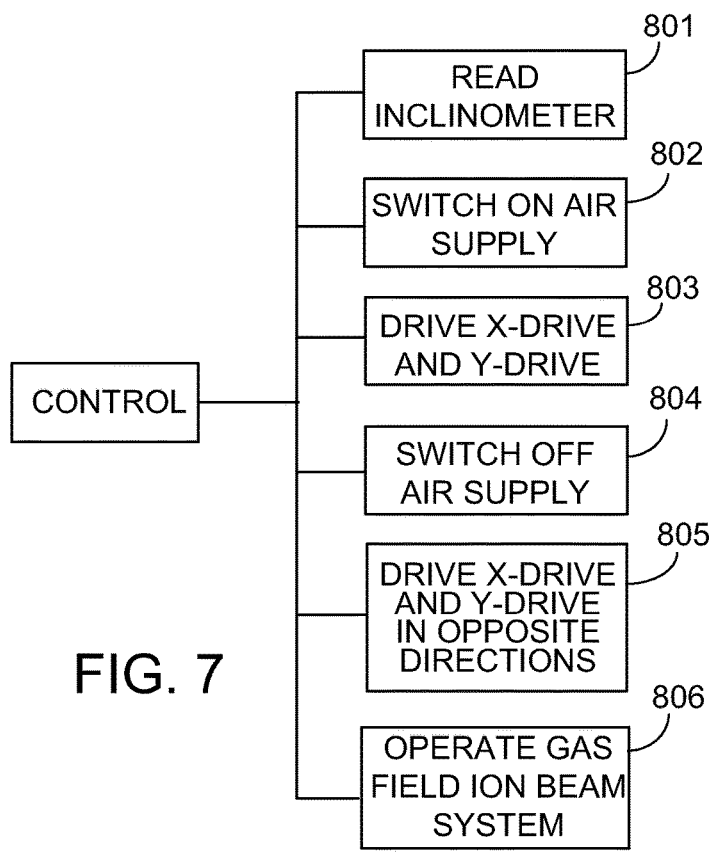
FIG. 7 shows a flow chart showing the adjustment of a tip apex.

The process of adjusting the tilt of the upper housing is described with reference to FIG. 7. In a first step 801 the actual adjusted tilt position of the upper housing 15 relative to the direction of gravity is stored by reading out an actual measurement value provided by the inclinometer 705. In the next step 802 the control 59 switches on the air supply for the air bearing between the two spherical surfaces between the upper housing 15 and the lower housing 16. Thereafter a step 803 follows in which the tilt drives 702; 703 are activated while continuing to read the actual measurement values provided by the inclinometer 705, until the inclinometer 705 provides the desired output reading of the newly adjusted tilt position of the upper housing 15 relative to the lower housing 16. When the new position is reached, in a step 804 the air supply for the air bearing between the upper housing 15 and the lower housing 16 is stopped. In a step 805 the drives 702, 703 are controlled to move into the opposite direction compared to the movement to reach the new tilt position until the peg disengages with the receptacle. Thereafter the gas field ion beam system can be operated in a step 806 with the upper housing 15 being in a new tilt position relative to the lower housing.

Since the old tilt position is stored, if desired the old tilt position can be readjusted by performing the above process anew but with opposite directions of movement of the drives 702, 703 until the inclinometer 705 provides the output signal indicating that the old tilt position has been reached again. This process can be used when rebuilding the tip of the gas field ion source, where usually the rebuilding of the tip is performed under a different orientation of the emitter tip than when operating the system to record images of a sample or process a sample.

Figure 8:
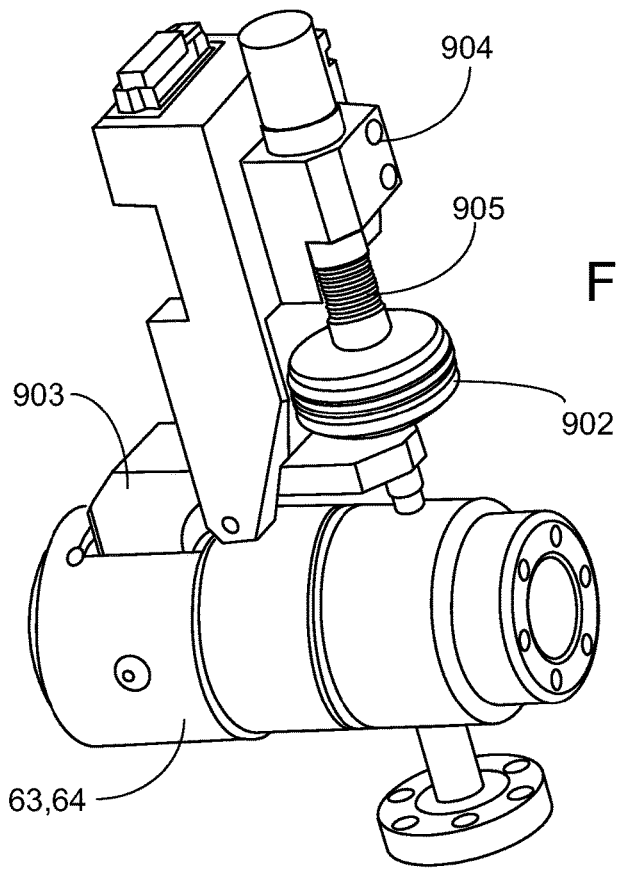
FIG. 8 shows a motorized leak valve
Figure 9:
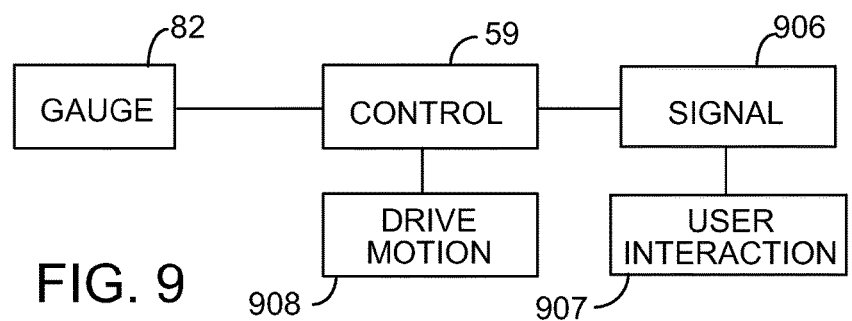
FIG. 9 shows a flow diagram regarding the adjustment of the air flow for a gas field ion source.

By way of explanation, the gas field ion beam system can produce images of samples by detecting particles leaving the sample due to the impinging ion beam, or manipulate and alter these samples with sub-nanometer precision. Therefore, it is critical that the ion microscope can operate without errors in the intended landing position of the focused ion beam. Such landing errors can be quite small (e.g. smaller than 100 nm, smaller than 10 nm, or even smaller than 1 nm) and still adversely impact the operation of the instrument. For the stable operation of the gas field ion beam system, a proper amount of the noble gas for the gas ionization in the vicinity of the emitter tip is to be ensured. To ensure a proper noble gas pressure, the gas supply system includes a leak valve 63, 64 (shown in FIG. 4 and in details in FIG. 8) that is either manually adjusted by the operator for the desired flow level, or adjusted by a motorized control system. In either case, the adjustment is established based upon a pre-established table of values that relates the mechanical adjustment (e.g. manual turns of a knob 902 or motor position) to the target value of the operating gas pressure. As shown in FIG. 9 the gas pressure can be evaluated from a gauge 82 located in the outer gas confinement 81 or a gauge 69 located in the gas manifold (gas delivery system, shown in FIG. 4). And in either case, the adjustments can be deferred until the microscopes highest precision activities are completed. In other words, the normal control loop can be interrupted during precision work. For example, if the gas pressure crosses out of the acceptable range, the control 59 can provide an indication 906 to the operator via the computer interface (e.g. a message indicating "gas pressure not in target"), or a light indicator that can change from green to red. And the operator can decide if the present microscope activity permits the corrective action, or if this action should be deferred. For reference, the normal gas pressure in the operating microscope might be indicated by a pressure gauge 82 that might read from $2.0 \times 10^{-6}$ Torr to $2.1 \times 10^{-6}$ Torr. If the pressure crosses outside of this range, it could affect the uniformity or consistency of the process which is underway. However, a corrective action could more seriously affect the fidelity of the work that is underway. Accordingly, as shown in FIG. 9 the control 59 is configured that it only activates a motor 904 in a step 908 after the control has received a user interaction 907 confirming that a correction of the gas flow through needle valve 63 or 64 is desirable at that time.

The leak valve that is in place can be a commercial manual precision leak valve that is incorporated into the gas field ion beam system. One leak valve 63 can be provided for the helium gas delivery system and one leak valve 64 can be provided for the neon gas delivery system as disclosed above in reference to FIG. 3. These leak valves 63, 64 are to be actuated manually without further modification, and with a calibration table that lists common desired gas pressures with the corresponding knob turns to achieve these pressures. An alternative embodiment for a motorized leak valve is shown in FIG. 8. This motorized leak valve is based on a commercially available manual leak valve 63, 64. At a housing portion 903 of the leak valve a drive motor 904 with a spindle 905 is attached. The spindle 905 acts on the manual adjustment knob 902 of the manual leak valve.

Alternatively, the knob mechanism of the manual leak valve can be dispensed with entirely, and can be substituted by a piezo-ceramic actuator. Or furthermore alternatively, the knob mechanism of the manual leak valve can be dispensed with, and can be substituted by a cam-type drive mechanism.

Figure 10:
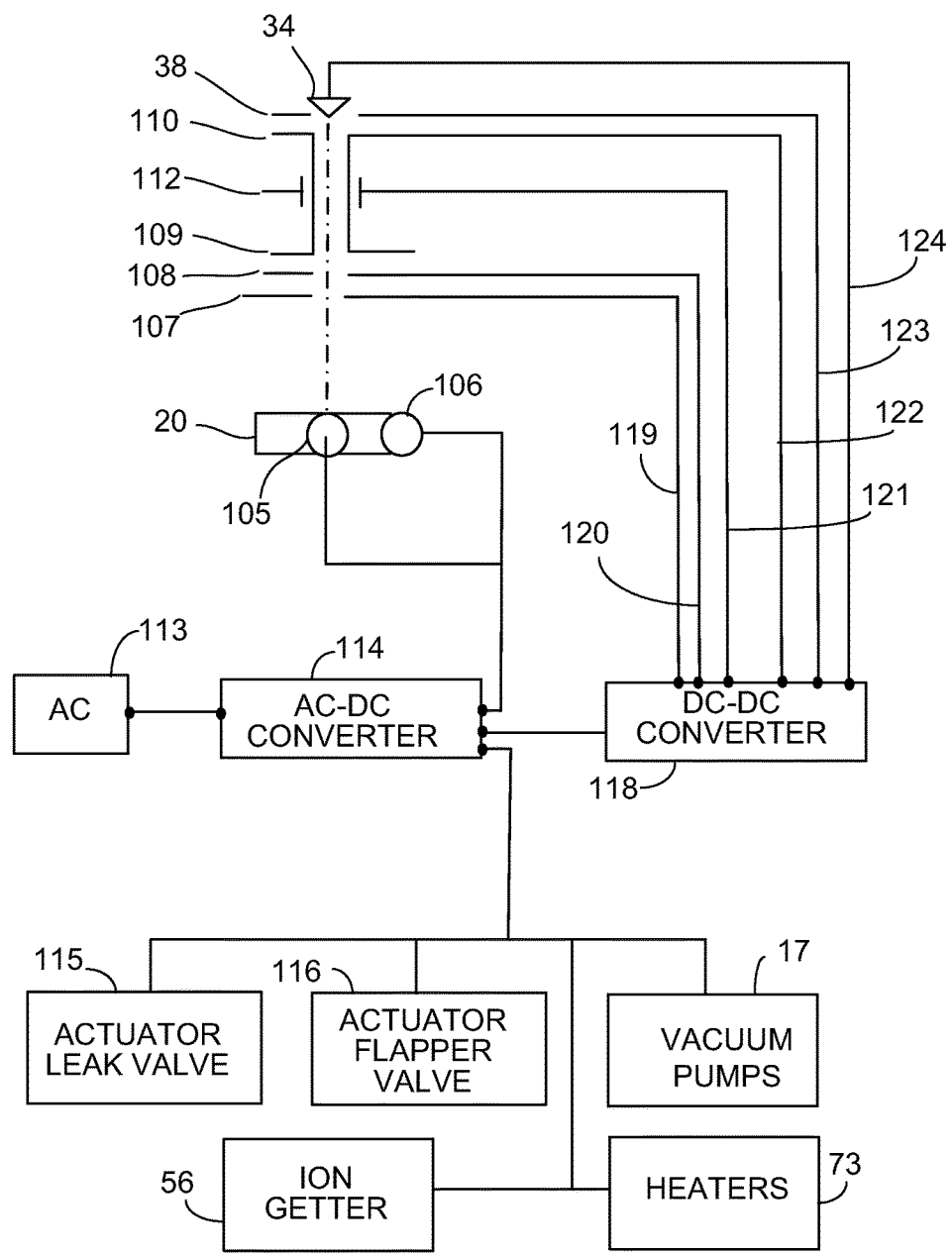
FIG. 10 shows a principle sketch of a gas field ion beam system with an electrical set-up.

FIG. 10 shows the electrical set-up of an embodiment of gas field ion beam system. As described above, the charged particle beam system comprises a charged particle source with an ion emitter having an electrically conductive tip 34, an extractor electrode 38 and a deceleration or acceleration electrode 110. Following downward in the direction of beam propagation follows a beam deflection system 112 with which the ion beam can be deflected in a direction perpendicular to its direction of propagation to scan the ion beam across a surface of a sample to be positioned on sample stage 20. In addition the charged particle beam system comprises an objective lens comprising several electrodes 107,108,109 to focus the ion beam on the surface of the sample to be positioned on the stage 20.

For positioning a sample relative to optical axis 125 defined by the symmetry of the electrodes 107,108,109 of the objective lens the sample stage 20 can be moved along and/or around several axis. Typically a sample stage 20 has four or five axis of freedom for movement. These five axis normally are linear movements perpendicular to optical axis 125, linear movement along optical axis 125, tilt or rotation around an axis perpendicular to the optical axis 125 and rotation around optical axis 125. For driving the movement a respective number of motor drives are arranged at stage 20 of which two drives 105, 106 are shown in FIG. 10.

In addition to the electrical motors 105, 106 the system comprises a number of additional electrically driven components such as the actuator 115 for the leak valves, the actuator 116 for the flapper valve, vacuum pumps 17, ion getter pump 56, heaters 73a, 73b, 73c, etc. For providing the supply power for all these drives which may need to be operated during operation of the charged particle beam system all these electrically powered devices are powered by the output power of an AC-DC converter 114 which is itself powered by the normal 50 Hz or 60 Hz power supply 113. This AC to DC converter 114 is configured to be positioned some meters, e.g. at least two meters, away from the nearest ion optical component of the charged particle beam system. Accordingly, all electrically driven components which are directly mounted in or at the charged particle beam system and which, during conventional operation of the charged particle beam system may be operated, are configured to be powered by the DC output of the AC-DC converter 114. In addition, for generating the high voltages to be applied to the emitter tip 34, the extractor electrode 38, acceleration and deceleration electrode 110, lens electrodes 107,108 and deflection system 112 a DC to DC voltage converter 118 is provided which is configured to generate several different high voltages from an in-coming DC voltage output of the AC-DC converter 114. The various output signals of DC to DC converter 118 are lead to the respective electrode of the charged particle beam system by respective supply cables or electrical supply lines 119-124.

By the above described electrical concept which avoids electrical devices close to the charged particle beam system which are driven by AC voltages and which need to be operated during operation of the charged particle beam system, disturbances with the frequency of the AC supply power of 50 Hz or 60 Hz can be reduced to a large extent.

FIG. 12 shows a sectional view of a gas field ion source with a radiation shield 803. The design of this gas field ion source is very similar to the gas field ion source described above with reference to FIG. 3. Also in this case the source comprises an inner cylindrical isolator 33 holding the emitter tip 34 as well as an outer cylindrical isolator 37 surrounding the inner isolator 33 and holding the extractor electrode 38 with hole 39. The space between the outer vacuum wall 801 and the outer cylindrical electrode 37 form the outer gas containment 81 and the space surrounded by the outer cylindrical electrode forms the inner gas confining vessel 41. To minimize radiative heat transfer from the components at room temperature such as the outer vacuum wall 801 the outer cylindrical electrode 37 and the extractor electrode 38 are surrounded by a radiation shield 803. The radiation shield 803 generally can be can shaped with a cylindrical tube with a cover 810 and a base 812 at the base sides of the cylinder. The radiation shield can be plated with polished gold to minimize its radiation absorption. The radiation shield is attached to the base plate 801 so that also the radiation shield is cooled to cryogenic temperature. Alternatively, the radiation shield also can have its own dedicated cooling connection to the cooling system like a dewar. However a can shaped radiation shield is less practical in cases in which a gas transfer is desirable between a region surrounded by the radiation shield and a region outside the radiation shield.

FIGS. 13a and 13b show sectional views of heat shields which can accomplish gas exchange between the region within the radiation shield and outside the radiation shield. In FIG. 13a the radiation shield comprises two concentric cylinders 805, 806, both made of metal with highly radiation reflecting outer surfaces. Both cylinders comprise a plurality of slots 807, 808, wherein the slots 807 in the inner cylinder 806 are rotationally offset with respect to the slots 808 in the outer cylinder 805. The width of the slots, the distance between both cylinders 805, 806 and the offset-angle between the slots in both cylinders are selected in a manner that there is no direct line of sight from outside the outer cylinder 805 to the inside of the inner cylinder 806. Any radiation passing a slot of the outer cylinder 805 thereby impinges on a remaining material portion of the inner cylinder 806.

The embodiment in FIG. 13b comprises a plurality of slabs 809 arranged in a cylindrical fashion with each of the slabs being inclined at an angle unequal to 0° and 90° to a radial direction from a cylinder axis 811. Also in this embodiment there is nearly no, or only a minimum direct line of sight for radiation coming from outside the cylindrical region to the inside of the cylindrical region surrounded by the slabs 809.

In both embodiments in FIGS. 13a and 13b gas can flow through the slots 807, 808 or between the slabs 809 from inside the heat shield to outside the heat shield or into the opposite direction while radiative heat transfer from outside the region surrounded by the heat shield into the region surrounded by the heat shield is strongly reduced.

The above disclosure can be summarized as follows:

In some embodiments of a process of operating a gas field ion source the gas field ion source can be initially heated to desorb any undesired atoms and molecules before any voltage is applied to the ion source. Since the gas field ion source in operation is cooled to cryogenic temperature (e.g. less than 90 Kelvin) this removes a large amount of atoms and molecules. The heating can be brief, for example just for a few seconds, but it should be a temperature of several hundreds of Kelvin, for example 500 Kelvin or even more.

In some embodiments of a process of operating a gas field ion source the gas field ion source can be operated at a maximum tolerable voltage applied between the emitter tip and the extractor electrode at times when it is not required to operate the source at its optimum operating voltage. This "stand-bye" voltage typically can be just below the voltage causing field evaporation of the emitter tip. This can serve to maximize a polarization of adsorbed atoms and hence minimizes the mobility of the adatoms and thereby reduces the chance of the adatoms of migrating toward the apex of the emitter tip.

In some embodiments the gas field ion source can be most vulnerable to the effects of undesired atoms, so it can be surrounded by cryogenically cooled surfaces so as to minimize the probability of thermal desorption of any adsorbed atoms which otherwise could arrive at the emitter of the gas field ion source.

In some embodiments of a process of operating a gas field ion source the cryogenically cooled surfaces can be periodically heated or photostimulated to desorb adsorbed atoms or molecules. During the heating process the gas field ion source should be shut down by strongly reducing the voltage between the emitter tip and the extractor electrode.

In some embodiments of a process of operating a gas field ion source as a preparation step, the vacuum vessel and the gas delivery system can be heated to high temperatures to facilitate outgassing, and help to mobilize surface and bulk contaminants. This can be done under partial vacuum in conjunction with other volatilizing gases.

In some embodiments of a process of operating a gas field ion source as a preparation step, the vacuum vessel and the gas delivery system can be electropolished to minimize its surface area.

In some embodiments of a gas field ion source the gun region can be equipped with a chemical getter, for example commercially available SAES getters, to provide high pumping of undesired gas species. This chemical getters are very effective when the desired gas species is a noble gas, since noble gases are not pumped. The chemical getters also are very effective for pumping hydrogen because this gas species is not effectively pumped by cryogenic methods. When the getter is chemically activated, the gas field ion source is normally heated and the gas field ion source can be disabled.

In some embodiments of a gas field ion source the gas delivery tube can pass through a cryogenic trap to cause impurities to condense. In some embodiments such portion of the gas delivery system can have a valve to permit purging.

In some embodiments of a gas field ion source the gas delivery system can have a purifier that contains a heated or unheated chemical getter to chemically trap any undesired atoms or molecules.

In some embodiments of a gas field ion source the gas delivery system can have a bye-pass so that the contents, including the undesired atoms and molecules, can be purged into a vessel other than the ultimate gun region.

In some embodiments of a gas field ion source the region of the gas field ion source can be equipped with an ion pump to pump undesired gas atoms, and the ion pump can be disabled when the desired gas is delivered and enabled during standby of the gas supply.

In some embodiments of a gas field ion source the vacuum vessel can be equipped with a conformal coating of non-evaporable getter similar to SAES getters.

In some embodiments of a gas field ion source the vacuum vessel can be equipped with a hydrogen pumping getter such as a titanium sublimation pump.

In some embodiments of a process of operating a gas field ion source the gas field ion source can be operated for a period of time to help condition or prepare the surfaces. Under the conditioning period, the ion source can be purged of adsorbed gas atoms through the bombardment of energetic, highly polarized neutral atoms. Also during the conditioning period, the extractor electrode, the suppressor electrode, lens electrodes and other surfaces, onto which the ion beam can impinge during operation of the gas field ion source, can be cleaned of adsorbed atoms or chemically attached atoms. The conditioning steps can be carried out with a heavier gas species if desired to accelerate the process.

In the above description features of aspects of different inventions are disclosed in combination. The scope of the present invention is not intended to be restricted to such combinations of features but has to be understood to be solely defined by the following claims.

What is claimed is:

1. A charged particle beam system, comprising:
a noble gas field ion beam source,
a charged particle beam column,
a housing defining a first vacuum region, a second vacuum region and a third vacuum region,
a first pressure limiting aperture arranged between the first vacuum region and the second vacuum region,
a second pressure limiting aperture arranged between the second vacuum region and the third vacuum region,
a mechanical vacuum pump operationally attached to the first vacuum region,
an ion getter pump operationally attached to the second vacuum region, and a gas supply attached to the first vacuum region,
wherein:
the ion getter pump is the only pump that is operationally attached to the second vacuum region;
the noble gas field ion beam source is arranged within the first vacuum region;
the second vacuum region is arranged within the charged particle beam column;
the charged particle column is configured to direct an ion beam generated by the noble gas field ion beam source from the first vacuum region through the second vacuum region to the third vacuum region; and
the gas supply is configured to supply a noble gas to the noble gas field ion beam source.

2. The charged particle beam system of claim 1, further comprising a control configured to switch-off the ion getter pump at times when the noble gas field ion beam source generates an ion beam.

3. The charged particle beam system of claim 2, wherein the control is configured to switch-on the ion getter pump only if a pressure within the first vacuum region is below a predefined pressure value.

4. The charged particle beam system of claim 1, further comprising:
a heater, and
a control configured to heat the heater to release atoms of the noble gas from the ion getter pump.

5. The charged particle beam system of claim 1, further comprising:
a flange to which the ion getter pump is attached to the charged particle beam system, and
a valve arranged within the flange between the ion getter pump and the charged particle beam column.

6. The charged particle beam system of claim 1, wherein:
the third vacuum region is a sample chamber,
the charged particle beam system further comprises:
a table on which the sample chamber is positioned,
a first vibration isolating system between the table and a floor onto which the table is to be positioned, and
a second vibration isolating system between the table and the sample chamber,
the mechanical vacuum pump is arranged at the table, and
the mechanical vacuum pump is connected to the first vacuum region via a flexible bellow.

7. The charged particle beam system of claim 6, wherein the flexible bellow comprises a first flexible bellow portion, a second flexible bellow portion and a stiff tube between the first and second flexible bellow portions.

8. The charged particle beam system of claim 6, wherein the table comprises a plate of stone or concrete.

9. The charged particle beam system of claim 1, further comprising:
a sample chamber;
a sample stage moveably arranged within the sample chamber,
ion optics; and
aperture plates,
wherein:
the ion optics and aperture plates are between the noble gas field ion source and the sample stage,
the housing is directly mounted to a tubular portion of the sample chamber,
the tubular portion forms an integral and non-detachable part of the sample chamber,
the tubular portion extends outwardly from a wall of the second housing, and
the ion optics and aperture plates are mounted within the tubular portion.

10. The charged particle beam system of claim 1, wherein the housing is a first housing, and the charged particle system further comprises:
an electrically conductive tip comprising a tip apex in the first housing,
the first housing having a first portion of a tiltable mount,
a second housing comprising charged particle optical components defining an optical axis, the second housing comprising a second portion of a tiltable mount configured to correspond to the first portion of the tiltable mount so that the first housing is tiltable relative to the second housing, the first and second portions of the tiltable mount are defining an air bearing, the second portion of the tiltable mount being connected to a tubular portion of the housing, and the tubular portion of the housing extending outward from a wall of the housing,
a motor drive configured to apply a tilt movement to the first housing relative to the second housing, and
a controller configured to control the motor drive and an air supply of the air bearing.

11. The charged particle beam system of claim 10, further comprising a measuring device configured to measure and store a tilting position of the first housing relative to the second housing.

12. The charged particle beam system of claim 11, wherein the controller is configured to control a tilt movement of the first housing by the motor drive to reposition the first housing into a previously stored tilting position.

13. The charged particle beam system of claim 12, wherein the controller is configured to stop the supply of air of the air bearing when the measuring device provides a signal that a previously stored tilting position has been reached.

14. The charged particle beam system of claim 1, wherein the gas supply comprises:
a leak valve providing a constant gas flow rate through the leak valve,
an actuator configured to change the constant gas flow rate through the leak valve,
a sensor configured to measure a gas pressure in the housing and to generate output signals, and
a controller configured to control a movement of the actuator to change the gas flow rate through the leak valve based on the output signals of the sensor,
wherein the controller is configured to receive user input so that, during use of the gas field ion source, the control moves the actuator to change the gas flow rate through the leak valve only after receiving user input that confirms that the controller should move the actuator.

15. The charged particle beam system of claim 6, further comprising a control configured to switch-off the ion getter pump at times when the noble gas field ion beam source generates an ion beam.

16. The charged particle beam system of claim 15, wherein the control is configured to switch-on the ion getter pump only if a pressure within the first vacuum region is below a predefined pressure value.

17. The charged particle beam system of claim 9, further comprising a control configured to switch-off the ion getter pump at times when the noble gas field ion beam source generates an ion beam.

18. The charged particle beam system of claim 10, further comprising a control configured to switch-off the ion getter pump at times when the noble gas field ion beam source generates an ion beam.

19. The charged particle beam system of claim 14, further comprising a control configured to switch-off the ion getter pump at times when the noble gas field ion beam source generates an ion beam.

* * * * *